(12) United States Patent
Dittrich et al.

(10) Patent No.: US 7,903,452 B2
(45) Date of Patent: Mar. 8, 2011

(54) MAGNETORESISTIVE MEMORY CELL

(75) Inventors: Rok Dittrich, Paris (FR); Ulrich Klostermann, Landshut (DE)

(73) Assignees: Qimonda AG, Munich (DE); Altis Semiconductor, SNC, Corbeil Essonnes Cedex (FR)

( * ) Notice: Subject to any disclaimer, the term of this patent is extended or adjusted under 35 U.S.C. 154(b) by 330 days.

(21) Appl. No.: 11/473,531

(22) Filed: Jun. 23, 2006

(65) Prior Publication Data

US 2007/0297219 A1    Dec. 27, 2007

(51) Int. Cl.
*G11C 11/16* (2006.01)

(52) U.S. Cl. .......................................... 365/158

(58) Field of Classification Search .................. 365/158, 365/171, 213, 97
See application file for complete search history.

(56) References Cited

U.S. PATENT DOCUMENTS

| | | | | |
|---|---|---|---|---|
| 6,535,416 B1* | 3/2003 | Daughton et al. | ............ | 365/145 |
| 6,633,498 B1* | 10/2003 | Engel et al. | ............ | 365/158 |
| 6,950,335 B2* | 9/2005 | Dieny et al. | ............ | 365/171 |
| 7,061,787 B2* | 6/2006 | Trouilloud et al. | ............ | 365/145 |
| 2003/0081475 A1 | 5/2003 | Weber et al. | | |
| 2003/0132468 A1* | 7/2003 | Raberg | ............ | 257/295 |
| 2006/0017126 A1* | 1/2006 | Bhattacharyya et al. | ...... | 257/421 |
| 2006/0077707 A1* | 4/2006 | Deak | ............ | 365/171 |
| 2006/0108620 A1 | 5/2006 | Rizzo et al. | | |
| 2007/0189064 A1* | 8/2007 | Min et al. | ............ | 365/158 |

FOREIGN PATENT DOCUMENTS

WO       03077257 A1     9/2003

OTHER PUBLICATIONS

Kerekes, M., et al., "Dynamic Heating in Sub-Micron Size Magnetic Tunnel Junctions with Exchange Biased Storage Layer," 3 pgs.
Wang, J., et al., "Low-Current Blocking Temperature Writing of Double-Barrier MRAM Cells," IEEE Transactions on Magnetics, vol. 40, No. 4, Jul. 2004, pp. 2622-2624.
Prejbeanu, I.L., et al., "Thermally Assisted Switching in Exchange-Biased Storage Layer Magnetic Tunnel Junctions," IEEE Transactions on Magnetics, vol. 40, No. 4, Jul. 2004, pp. 2625-2627.

* cited by examiner

*Primary Examiner* — Anh Phung
*Assistant Examiner* — Douglas King

(57) ABSTRACT

A magnetoresistive memory cell has a magnetic stack providing an effective anisotropy field of a storage layer of the magnetic stack during thermal select heating, at least one line providing at least one external magnetic field to the magnetic stack, the effective anisotropy field and the at least one external magnetic field having a non-zero angle relative to one another.

38 Claims, 20 Drawing Sheets

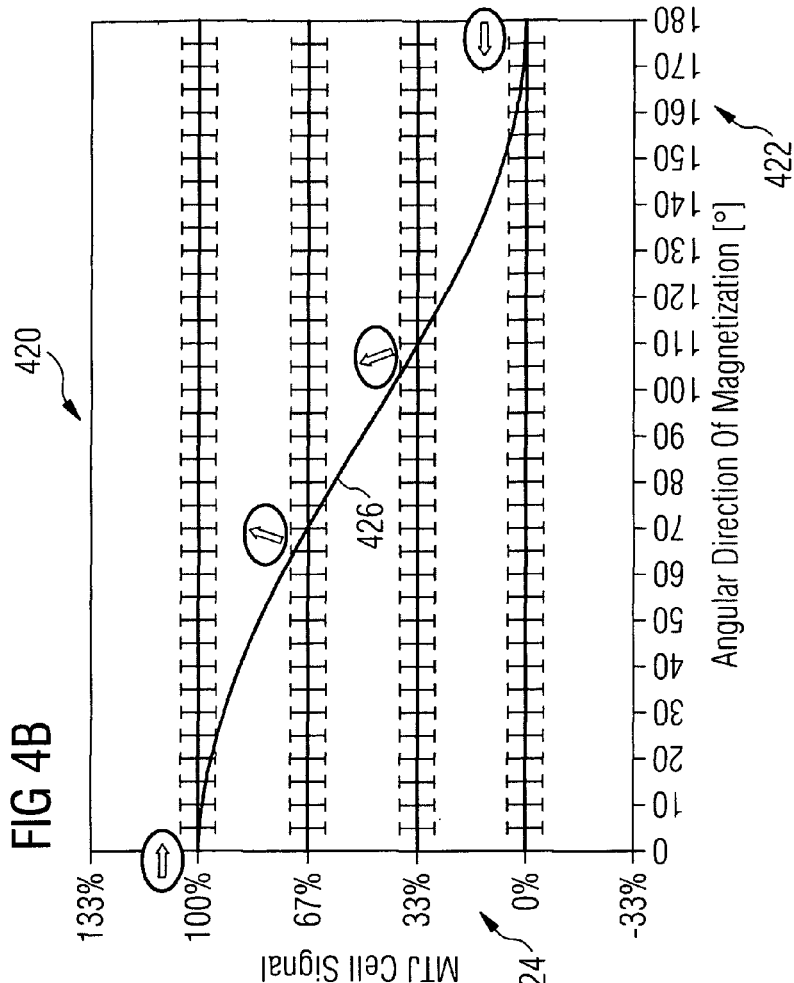
FIG 4A
FIG 4B
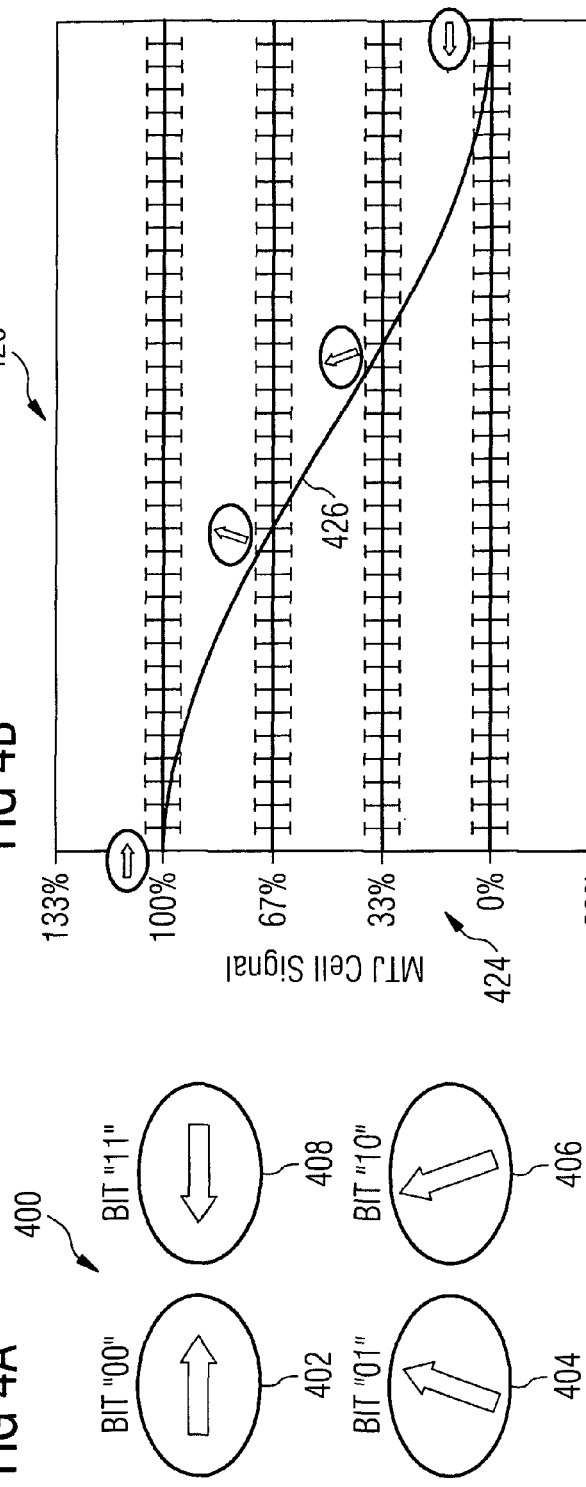
FIG 4C
Equidistant Resistance Levels for 2 bits:
| bit | Signal | [°] | EA H | HA H |
|-----|--------|-----|---------|-------|
| "11" | 0% | 0 | 100 Oe | 0 |
| "10" | 33% | 70 | 34 Oe | 94 Oe |
| "01" | 67% | 110 | -34 Oe | 94 Oe |
| "00" | 100% | 180 | -100 Oe | 0 |

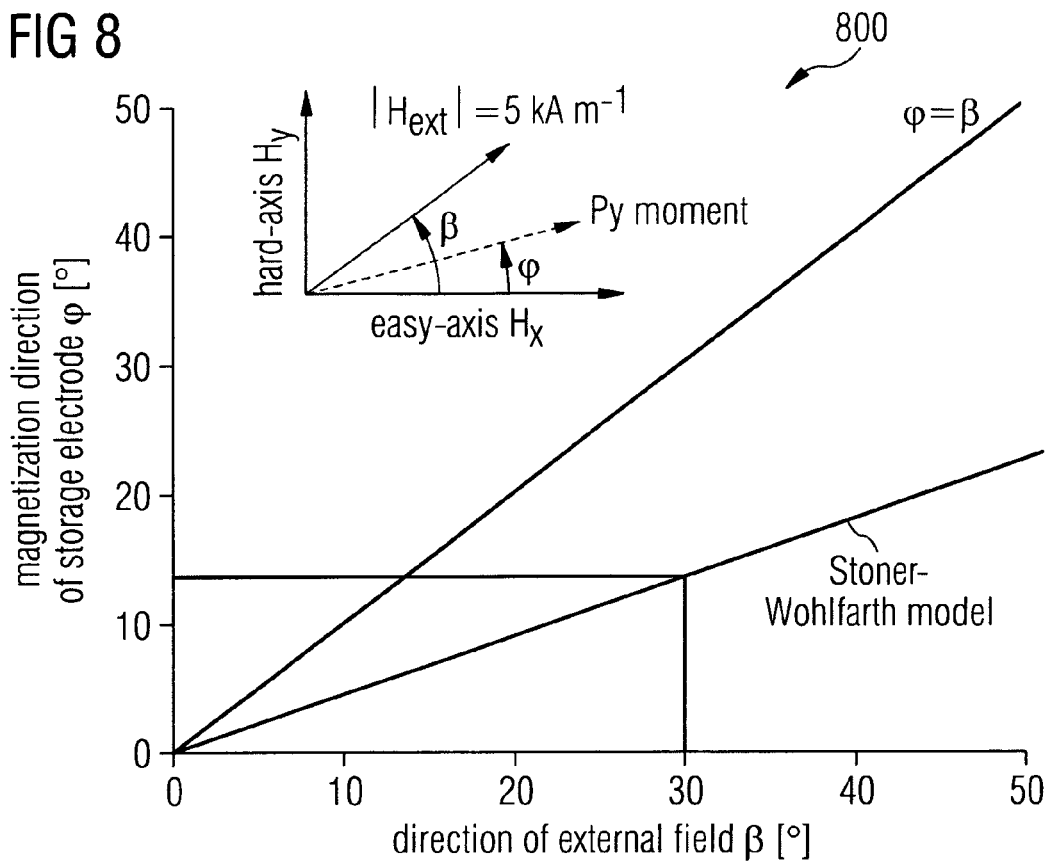
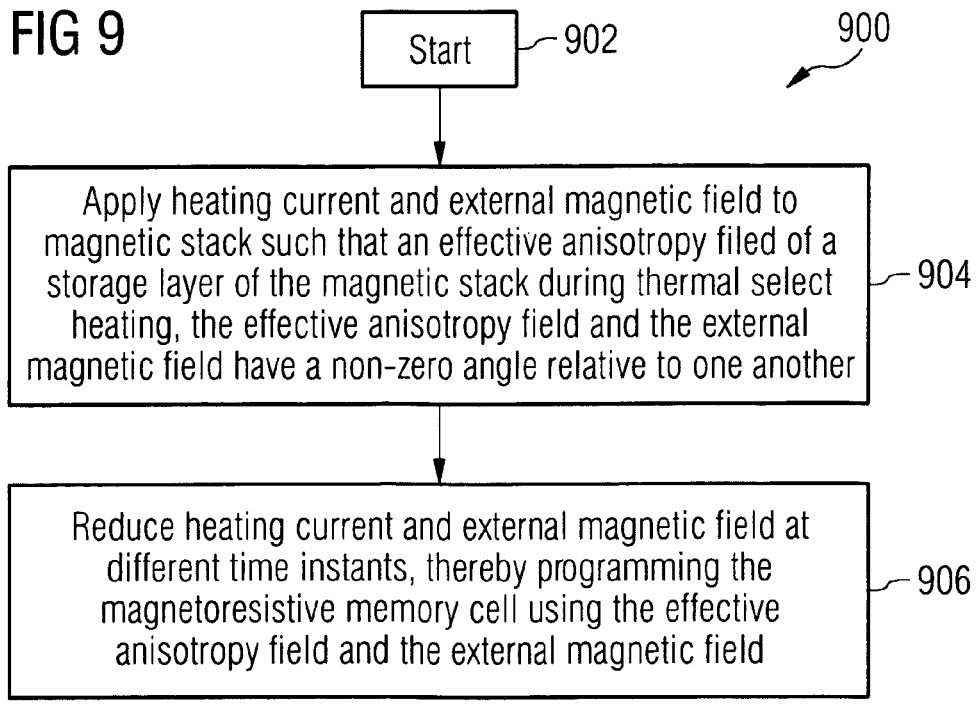

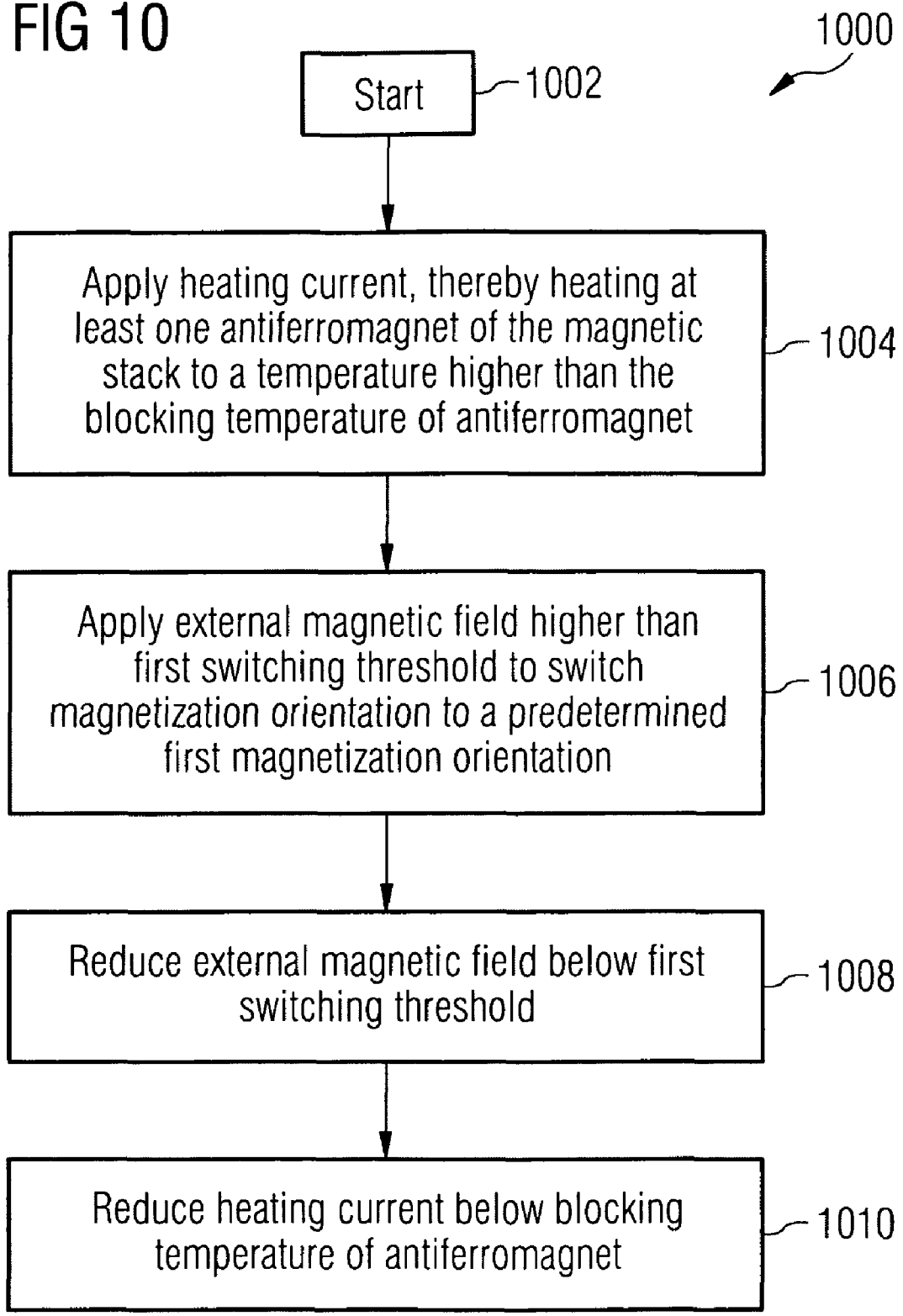

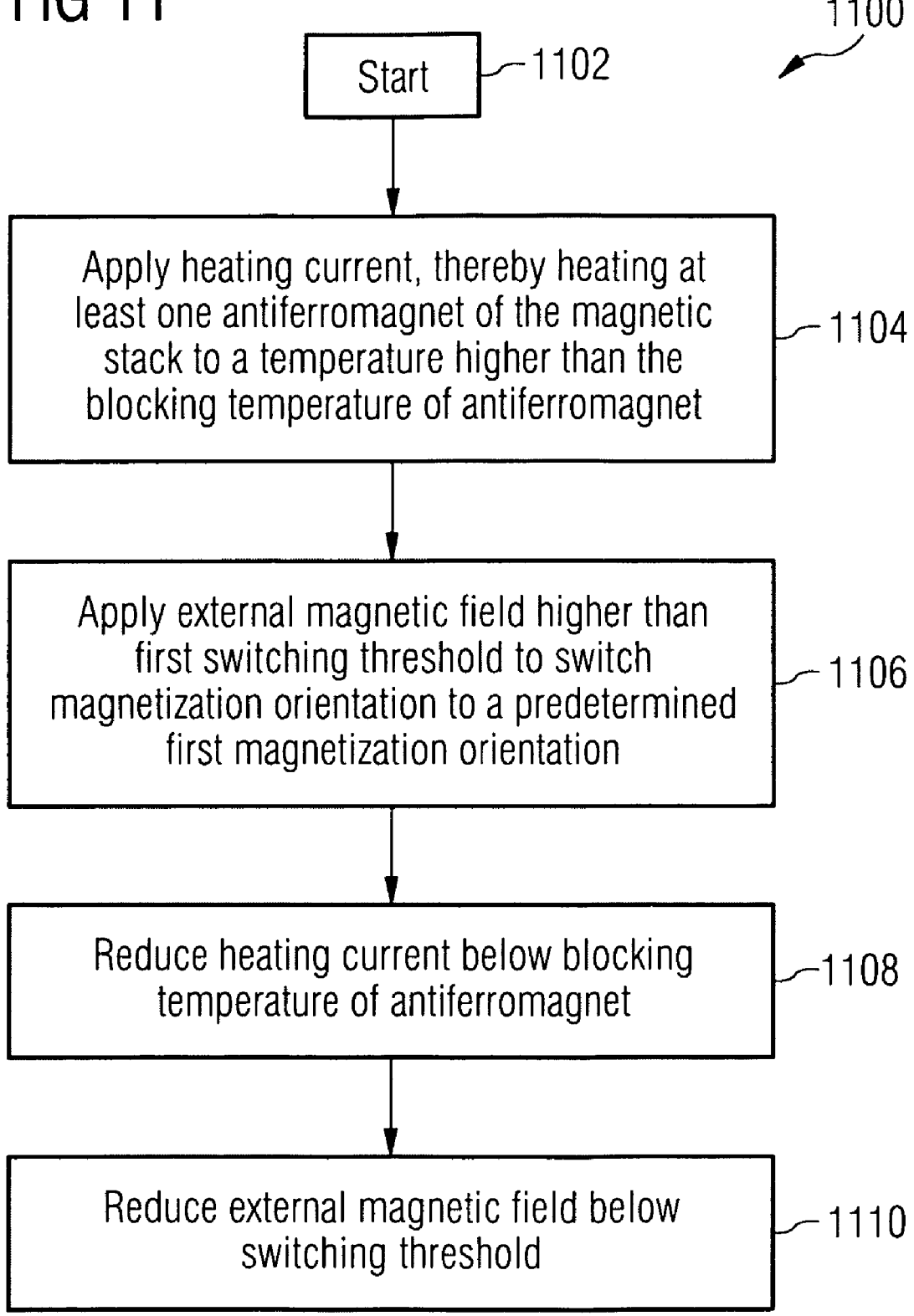

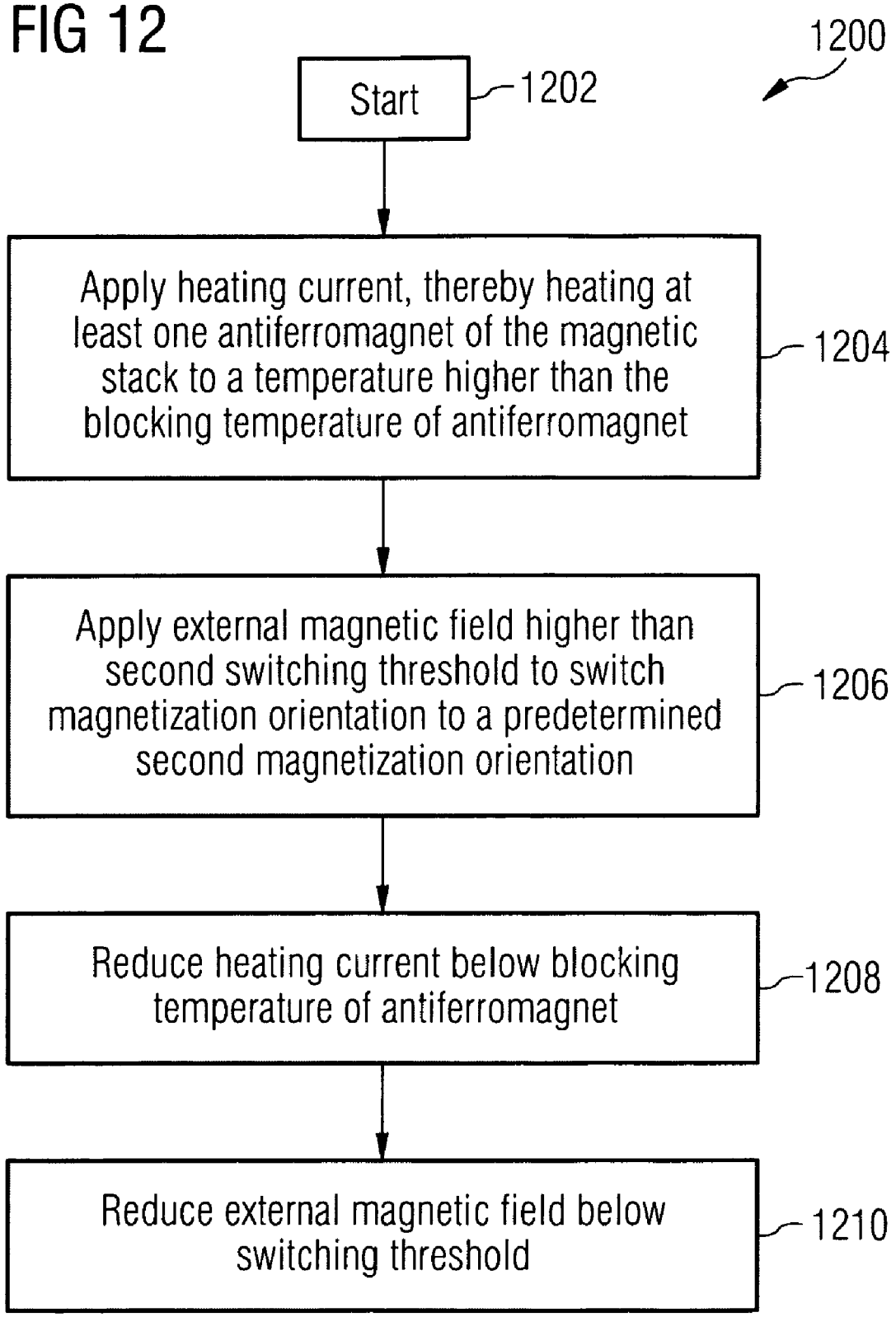

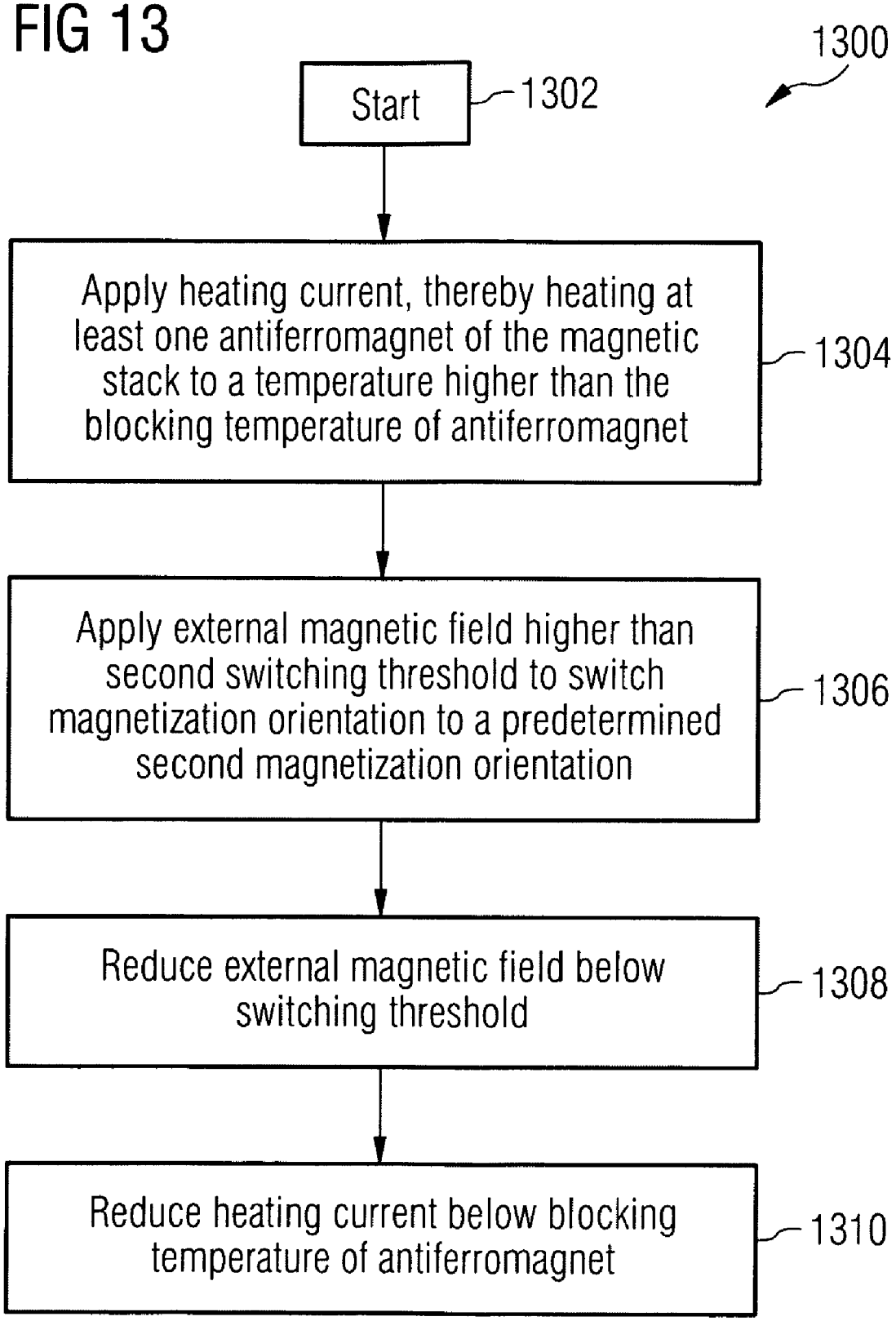

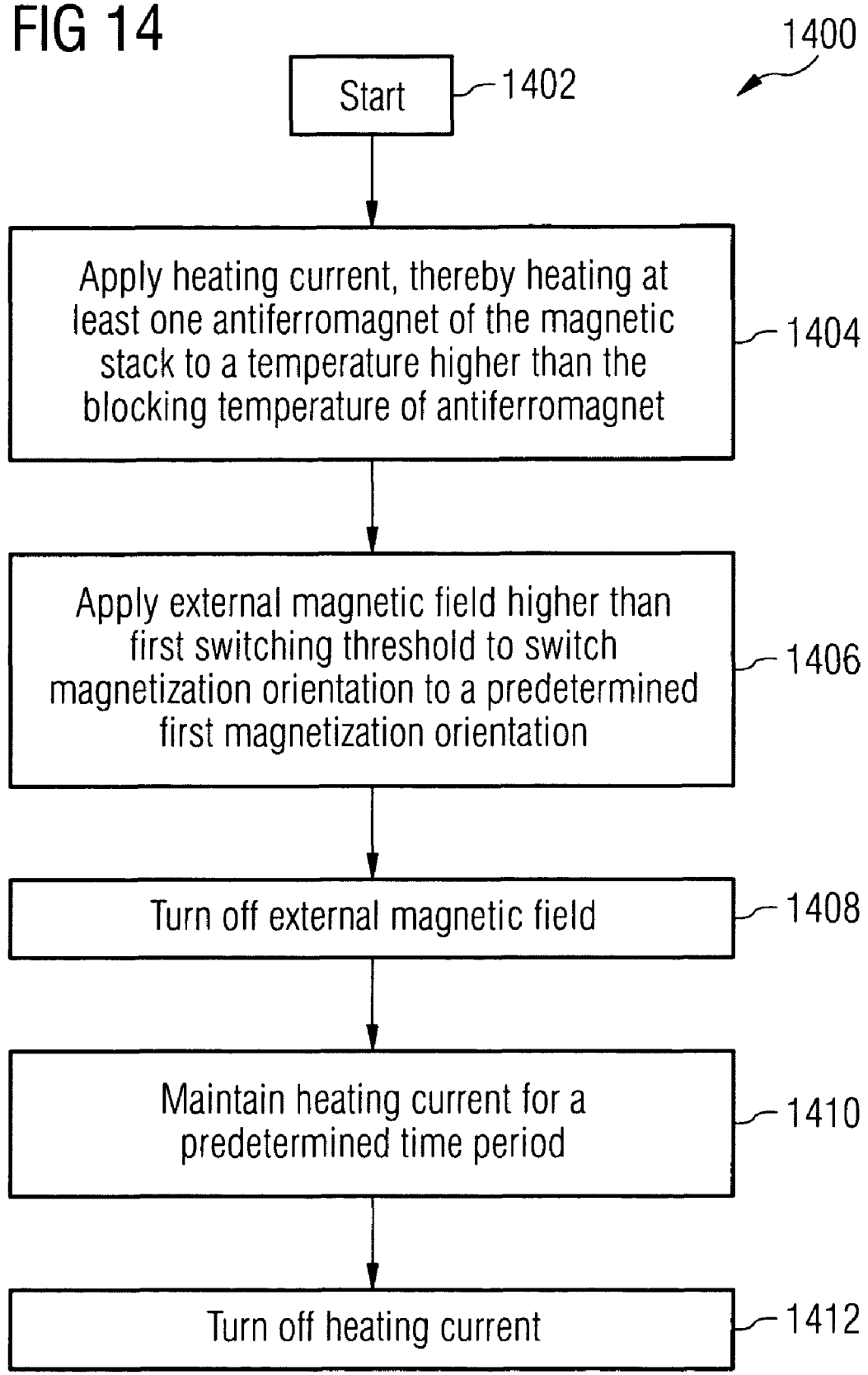

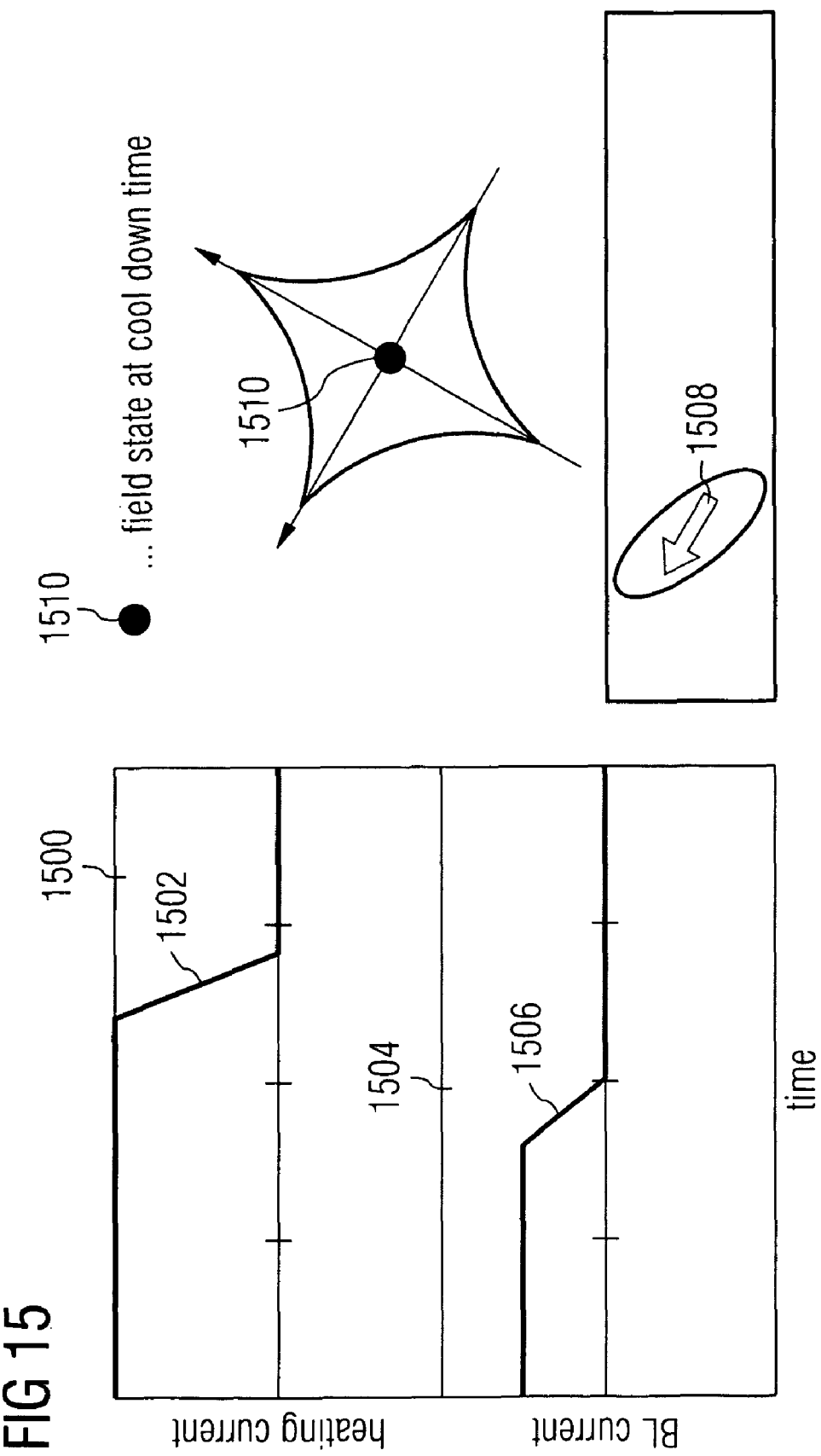

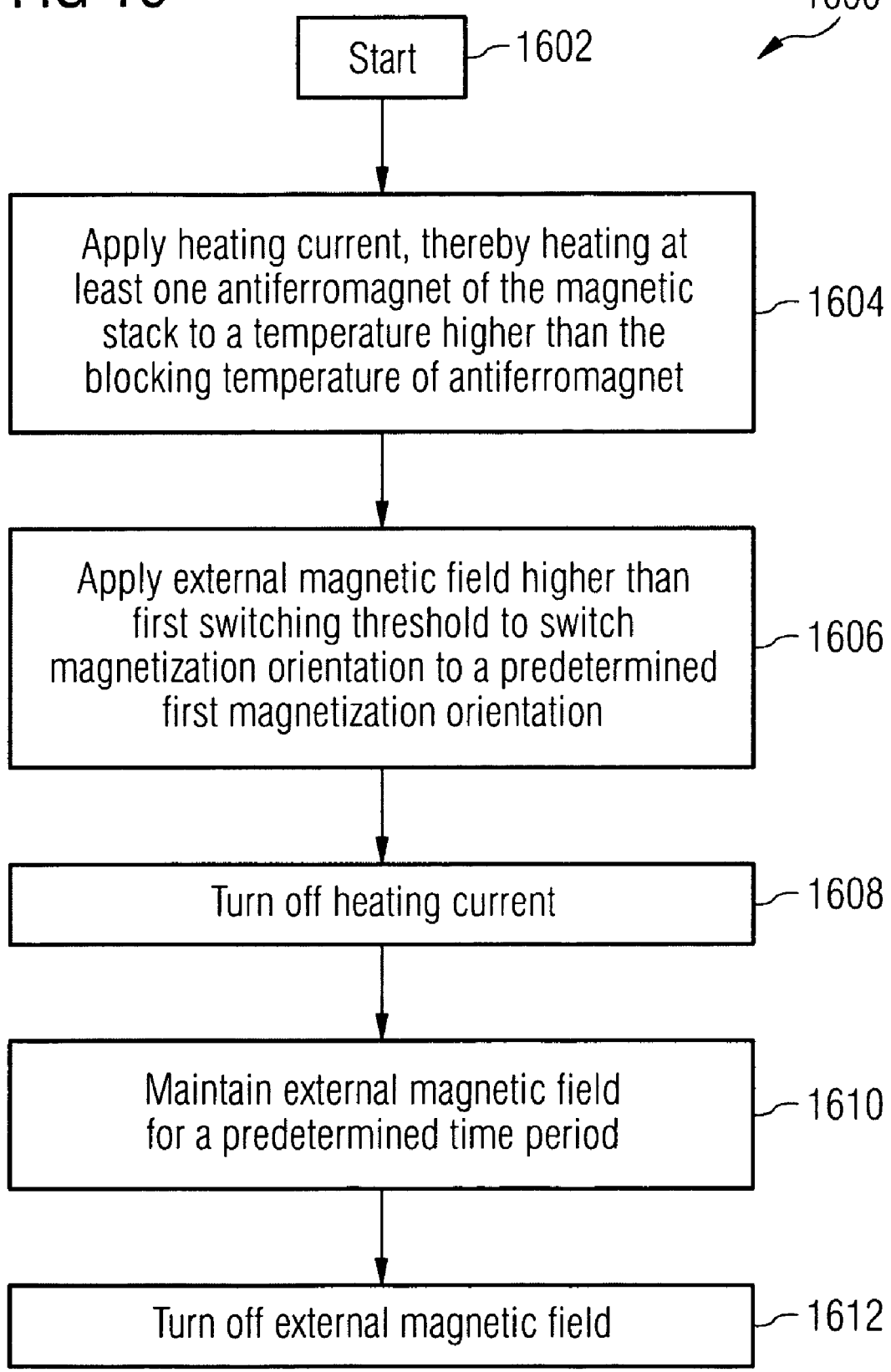

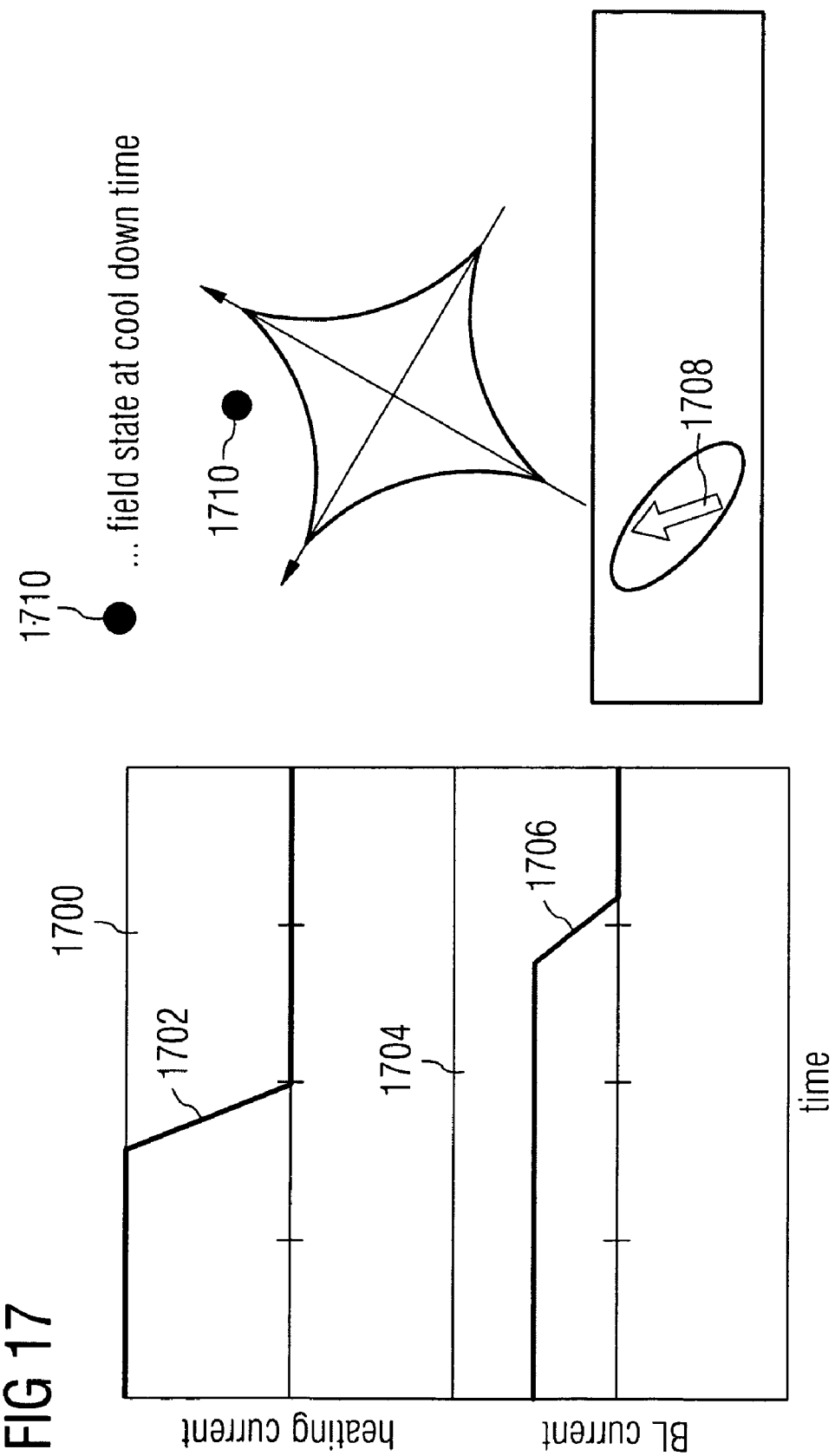

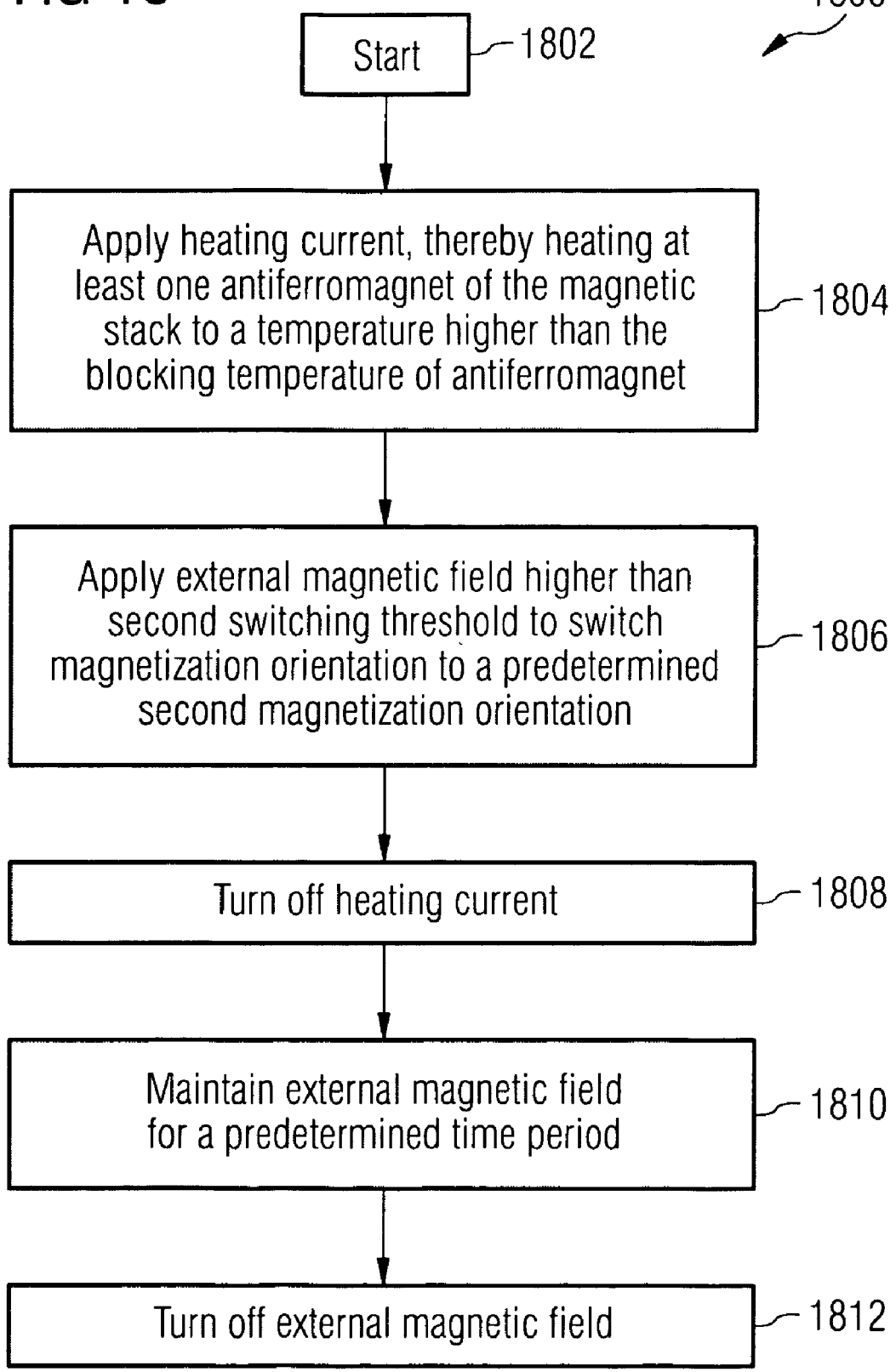

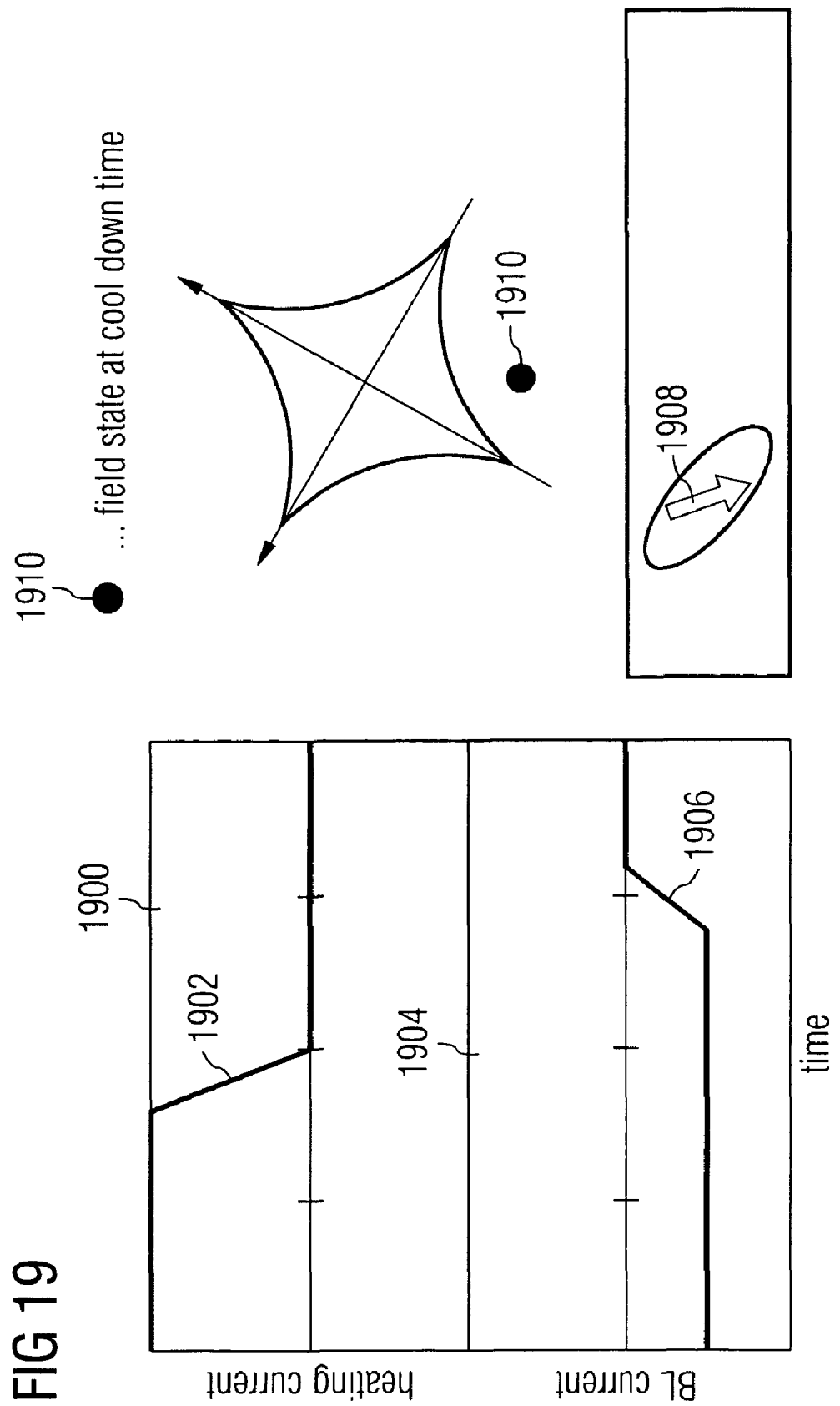

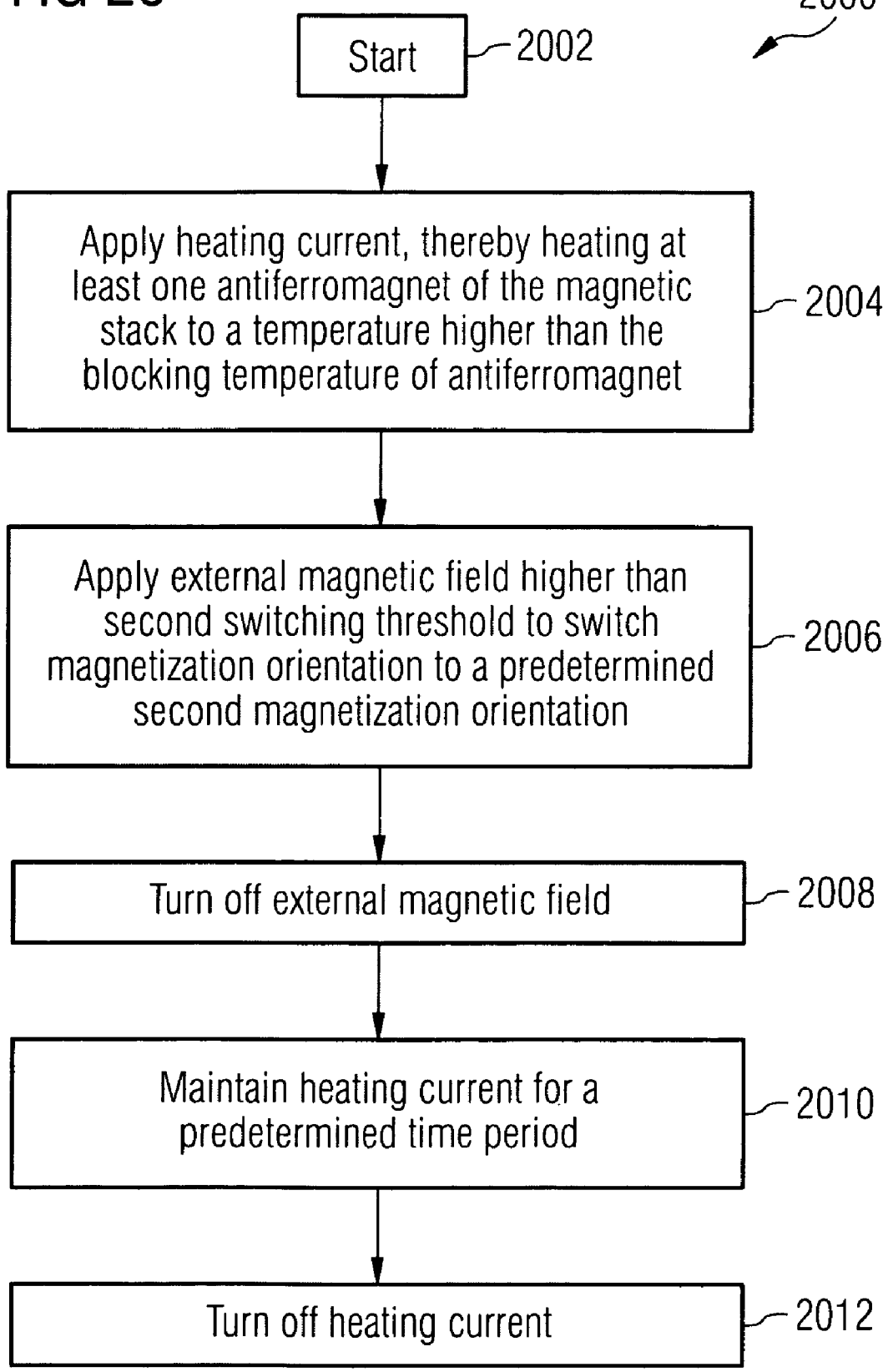

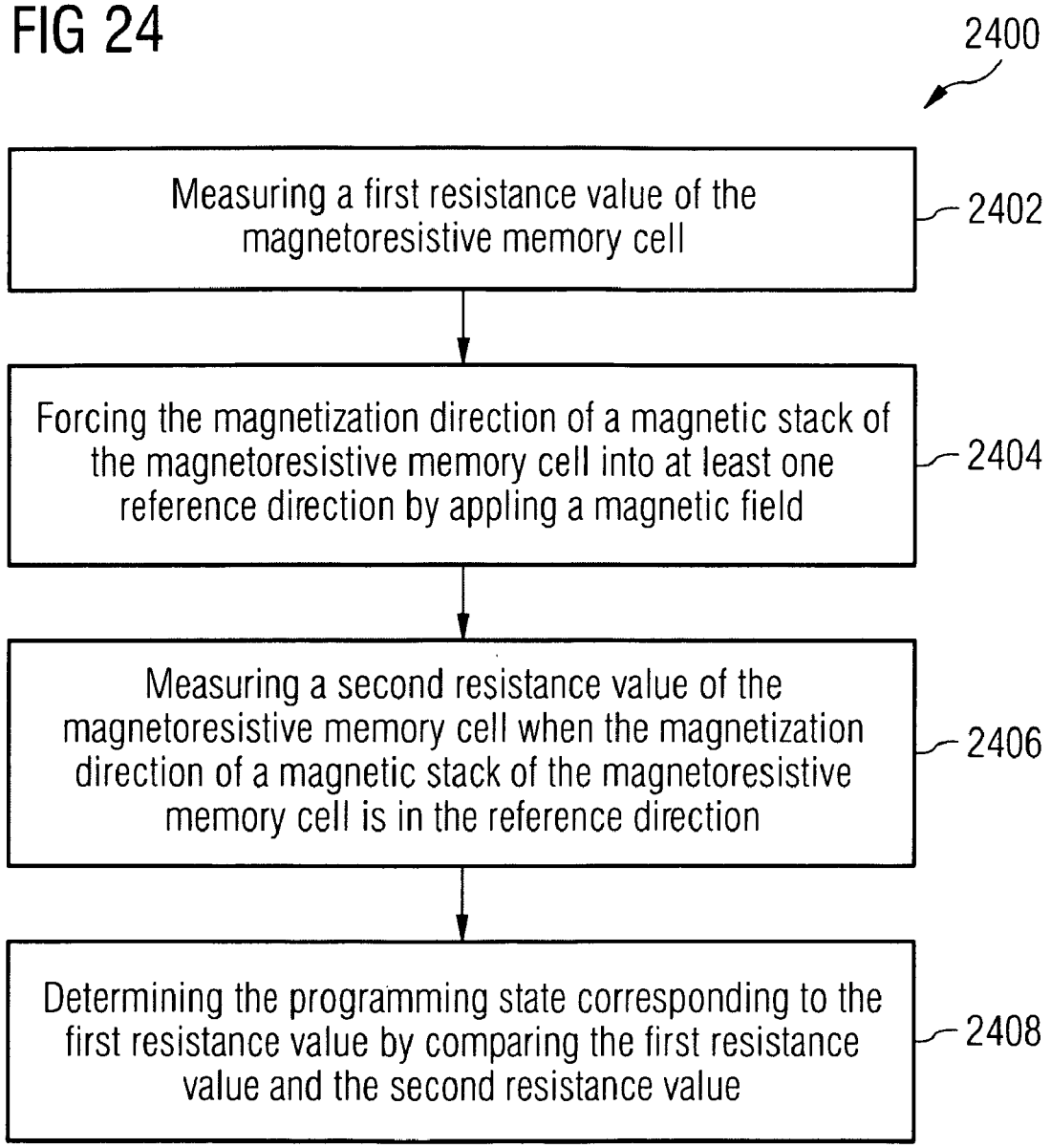

MAGNETORESISTIVE MEMORY CELL

TECHNICAL FIELD

The invention relates to a magnetoresistive memory cell and methods of reading a magnetoresistive memory cell.

BACKGROUND

A common magnetoresistive memory cell used is based on the tunnelling magnetoresistance effect (TMR). In this case, there is a magnetic tunnel junction (MTJ) in each memory cell. The MTJ in the simplest form may be a metal/insulator/metal structure with ferromagnetic electrodes. The electrical tunnel resistance depends on the relative orientation of the magnetization vector of the ferromagnetic electrodes. If the magnetization vectors are parallel, then the tunnel resistance is small. If the magnetization vectors are antiparallel, then the tunnel resistance is higher.

There is a need to further increase the storage capacity of a magnetoresistive memory cell.

For these and other reasons, there is a need for the present invention as set forth in the following in the embodiments.

SUMMARY OF THE INVENTION

In one embodiment of the invention, a magnetoresistive memory cell includes a magnetic stack providing an effective anisotropy field of a storage layer of the magnetic stack during thermal select heating. At least one line provides at least one external magnetic field to the magnetic stack. The effective anisotropy field and the at least one external magnetic field have a non-zero angle relative to one another.

These and other features of the invention will be better understood when taken in view of the following drawings and a detailed description.

BRIEF DESCRIPTION OF THE DRAWINGS

For a more complete understanding of the present invention, and the advantages thereof, reference is now made to the following descriptions taken in conjunction with the accompanying drawing, in which:

FIGS. 4A to 4C illustrate the principle of a thermal select multi-level MRAM cell in accordance with one embodiment of the invention;

FIG. 8 shows a diagram illustrating the dependency of the magnetization direction of the storage layer from the direction of an applied external field for an MRAM cell;

FIG. 9 shows a flow diagram illustrating a method of programming a magnetoresistive memory cell in accordance with one embodiment of the invention;

FIG. 10 shows a flow diagram illustrating a process of programming the first magnetization state into the MRAM cell in accordance with one embodiment of the invention;

FIG. 11 shows a flow diagram illustrating a process of programming the second magnetization state into the MRAM cell in accordance with one embodiment of the invention;

FIG. 12 shows a flow diagram illustrating a process of programming the third magnetization state into the MRAM cell in accordance with one embodiment of the invention;

FIG. 13 shows a flow diagram illustrating a process of programming the fourth magnetization state into the MRAM cell in accordance with one embodiment of the invention;

FIG. 14 shows a flow diagram illustrating a process of programming the first magnetization state into the MRAM cell in accordance with one embodiment of the invention;

FIG. 15 shows timing diagrams illustrating a process of programming the first magnetization state into the MRAM cell in accordance with one embodiment of the invention;

FIG. 16 shows a flow diagram illustrating a process of programming the second magnetization state into the MRAM cell in accordance with one embodiment of the invention;

FIG. 17 shows timing diagrams illustrating a process of programming the second magnetization state into the MRAM cell in accordance with one embodiment of the invention;

FIG. 18 shows a flow diagram illustrating a process of programming the third magnetization state into the MRAM cell in accordance with one embodiment of the invention;

FIG. 19 shows timing diagrams illustrating a process of programming the third magnetization state into the MRAM cell in accordance with one embodiment of the invention;

FIG. 20 shows a flow diagram illustrating a process of programming the fourth magnetization state into the MRAM cell in accordance with one embodiment of the invention;

FIG. 24 shows a flow diagram illustrating a read process reading the state of an MRAM cell in accordance with yet another embodiment of the invention.

DETAILED DESCRIPTION OF ILLUSTRATIVE EMBODIMENTS

Figure 1:
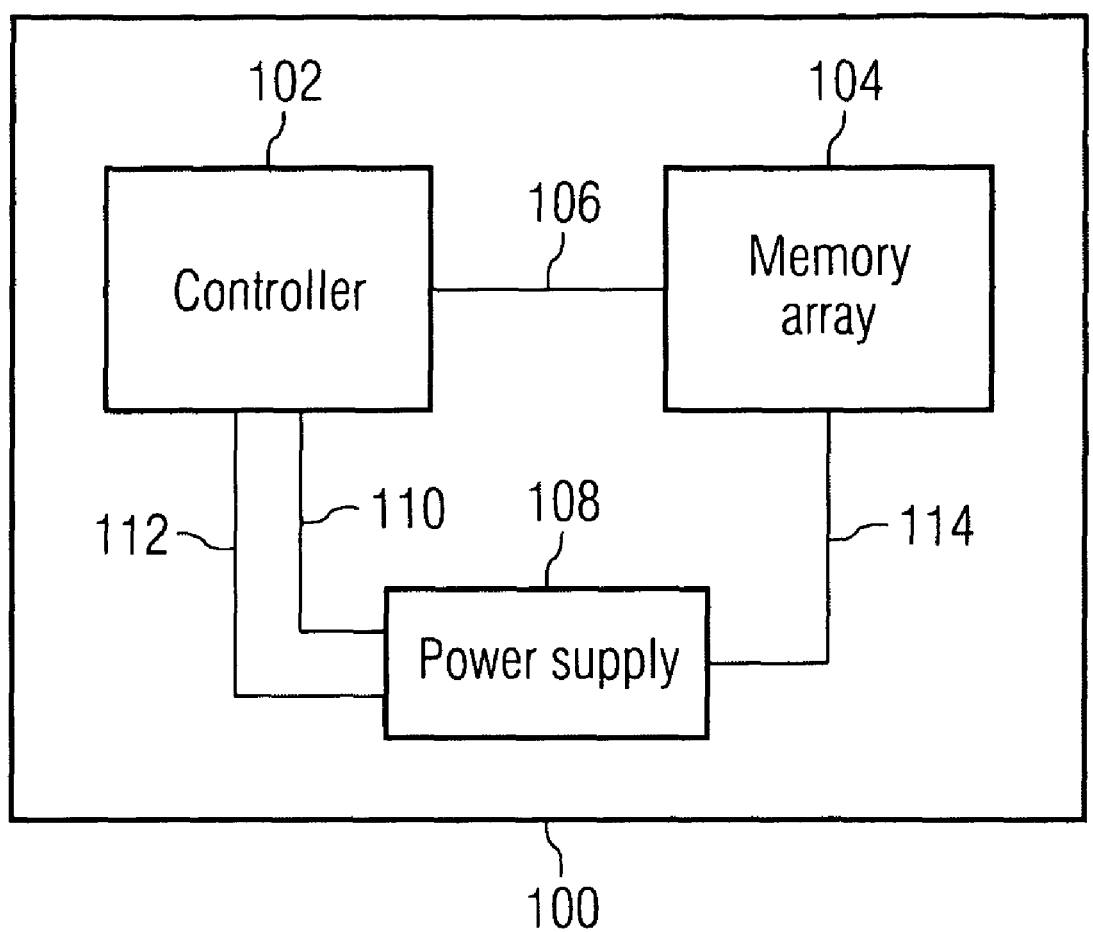
FIG. 1 illustrates a memory cell arrangement in accordance with one embodiment of the invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In one embodiment of the invention, the effective anisotropy field is parallel to the easy axis of the magnetic stack.

In one embodiment of the invention, the effective anisotropy field may be understood as the anisotropy field generated in a storage layer of the magnetic stack when it is heated, e.g., above the blocking temperature of at least one anti-ferromagnet of the magnetic stack. In one embodiment of the invention, the effective anisotropy field is a shape anisotropy field and/or an intrinsic anisotropy field, i.e., an anisotropy field that is dependent from the materials of the magnetic stack, e.g., dependent from the material(s) of the storage layer of the magnetic stack including growth conditions of the material(s) of the storage layer of the magnetic stack. Furthermore, any type of anisotropy field may be used in alternative embodiments of the invention, e.g., higher order shape or intrinsic anisotropy fields such as cubic anisotropy fields.

In one embodiment of the invention, the magnetic stack and the at least one line are arranged relative to one another such that the effective anisotropy field and the at least one external magnetic field have a non-zero angle relative to one another.

In one embodiment of the invention, the at least one line provides a heating current and at least one external magnetic field to the magnetic stack.

In one embodiment of the invention, the magnetic stack is a magnetic tunnel junction stack. However, any other type of magnetic stack may be used within a magnetoresistive memory cell in accordance with alternative embodiments of the invention.

In one embodiment of the invention, the magnetic stack has a first ferromagnetic layer, an insulating layer disposed above the first ferromagnetic layer, and a second ferromagnetic layer disposed above the insulating layer.

In another embodiment of the invention, the magnetic stack is arranged along its easy axis in a non-zero angle relative to the at least one line. A magnetic stack that has an elongated structure with an aspect ratio unequal "1" usually provides a shape anisotropy and thus a magnetic shape anisotropy field. In case the magnetic stack has an elongated structure such that it extends more in a first main direction (e.g., the length of the magnetic stack) and less in a second main direction (e.g., the width of the magnetic stack), thereby, e.g., having an ellipse structure, a shape anisotropy field is provided. By way of example, the first main direction is also referred to as the easy axis of the magnetic stack. The easy axis may be understood to refer to the energetically favorable direction of the spontaneous magnetization in a ferromagnetic material. The second main direction, which may be perpendicular to the first main direction, is also referred to as the hard axis of the magnetic stack. The hard axis may be understood to refer to the energetically less favorable direction of the spontaneous magnetization in a ferromagnetic material compared with the easy axis. The provided magnetic shape anisotropy field is usually provided along the easy axis of the magnetic stack. It should be mentioned that in an alternative embodiment of the invention, a magnetic stack with an aspect ratio equal "1" may be used, in case that, e.g., the intrinsic anisotropy is used for providing the effective anisotropy field.

In one embodiment of the invention, the non-zero angle between the shape anisotropy field and the at least one external magnetic field has a value in the range of about 5° to about 175°, e.g., a value in the range of about 15° to about 85°. In general, the non-zero angle can be any angle that provides a second vector component in addition to the vector component that is provided by the external magnetic field, in order to provide the required 2° of freedom in order to set the magnetization orientation of the magnetic stack, more accurately, of a storage layer of the magnetic stack, which is not fixed in its magnetization orientation during heating, in a large variety of different desired positions, i.e., in a large variety of different desired angles.

In one embodiment of the invention, the effective anisotropy field (e.g., the shape anisotropy field and/or the intrinsic anisotropy field) (intrinsic cell property, parallel to the easy axis) is combined with the externally generated field, e.g., generated by one line, which may be a metal line. The two fields have a non-zero angle relative to each other, which allows a multilevel state selection. In one embodiment of the invention, the selection of the different states is controlled by different timing sequences of the heating current and the bipolar field current, which will be described in more detail below. For example, if the cell is switched by the field and the heating is turned off after the field pulse, the resulting magnetization direction will be aligned along the easy axis. Alternatively, if the heating current is turned off while the field pulse is still present, the magnetization direction will result in an off-easy axis direction. With this method, at least four states or more can be set with a single field metal line, thereby enabling storing at least two bits of information into a magnetoresistive memory cell.

In one embodiment of the invention, the at least one line may be exactly one field line that may be used to generate the external magnetic field. In other words, one embodiment of the invention enables the abandonment of one metal line in the architecture of the memory cell for programming the cell. However, it should be mentioned that in an alternative embodiment of the invention, a plurality of lines may also be provided that together generate the external magnetic field for programming the magnetization orientation of the memory cell. Furthermore, in an alternative embodiment of the invention, a plurality of bit lines may be provided, e.g., a first bit line for generating the external magnetic field and a second bit line for electrically contacting the magnetic stack. The at least one line may be made of a metal such as copper, aluminium and the like.

In one embodiment of the invention, the heating current and the at least one external magnetic field are provided by one electrical source current, which may be divided into the heating current and the current that generates the at least one external magnetic field.

In another embodiment of the invention, a memory cell arrangement is provided, having a magnetic stack providing an effective anisotropy field of a storage layer of the magnetic stack during thermal select heating, the effective anisotropy field being parallel to the easy axis of the magnetic stack, at least one line providing at least one external magnetic field to the magnetic stack, the effective anisotropy field and the at least one external magnetic field having a non-zero angle relative to one another. Furthermore, the memory cell arrangement has a controller programming the magnetoresistive memory cell. The effective anisotropy field may be a shape anisotropy field and/or an intrinsic anisotropy field.

In one embodiment of the invention, the magnetic stack and the at least one line are arranged relative to one another such that the effective anisotropy field and the at least one external magnetic field have a non-zero angle relative to one another. The at least one line may further provide a heating current to the magnetic stack.

Furthermore, the controller may be configured such that a first programming state is programmed into the magnetoresistive memory cell by carrying out a first programming process. The heating current is applied to the magnetic stack, the heating current heating at least one anti-ferromagnet of the magnetic stack to a temperature higher than a blocking temperature of the anti-ferromagnet of the magnetic stack. The external magnetic field is applied to the magnetic stack, the external magnetic field being higher than a first switching threshold required in order to switch the magnetization orientation of a storage layer of the magnetic stack into a predetermined first magnetization orientation. The external magnetic field is reduced below the first switching threshold. After having reduced the external magnetic field below the first switching threshold, the heating current is reduced below the blocking temperature of the anti-ferromagnet of the magnetic stack.

In one embodiment of the invention, the controller is configured such that a second programming state is programmed into the magnetoresistive memory cell by carrying out a second programming process. The heating current is applied to the magnetic stack, the heating current heating at least one anti-ferromagnet of the magnetic stack to a temperature higher than a blocking temperature of the anti-ferromagnet of the magnetic stack. The external magnetic field is applied to the magnetic stack, the external magnetic field being higher than a first switching threshold required in order to switch the magnetization orientation of a storage layer of the magnetic stack into a predetermined first magnetization orientation. The heating current is reduced below the blocking temperature of the anti-ferromagnet of the magnetic stack. After having reduced the heating current below the blocking temperature of the anti-ferromagnet of the magnetic stack, the external magnetic field is reduced below the first switching threshold.

In one embodiment of the invention, the controller is configured such that a third programming state is programmed into the magnetoresistive memory cell by carrying out a third programming process. The heating current is applied to the magnetic stack, the heating current heating at least one anti-ferromagnet of the magnetic stack to a temperature higher than a blocking temperature of the anti-ferromagnet of the magnetic stack. The external magnetic field is applied to the magnetic stack, the external magnetic field being higher than a second switching threshold required in order to switch the magnetization orientation of a storage layer of the magnetic stack into a predetermined second magnetization orientation. The heating current is reduced below the blocking temperature of the anti-ferromagnet of the magnetic stack. After having reduced the heating current below the blocking temperature of the anti-ferromagnet of the magnetic stack, the external magnetic field is reduced below the second switching threshold.

In one embodiment of the invention, the controller is configured such that a fourth programming state is programmed into the magnetoresistive memory cell by carrying out a fourth programming process. The heating current is applied to the magnetic stack, the heating current heating at least one anti-ferromagnet of the magnetic stack to a temperature higher than a blocking temperature of the anti-ferromagnet of the magnetic stack. The external magnetic field is applied to the magnetic stack, the external magnetic field being higher than a second switching threshold required in order to switch the magnetization orientation of a storage layer of the magnetic stack into a predetermined second magnetization orientation. The external magnetic field is reduced below the second switching threshold. After having reduced the external magnetic field below the second switching threshold, the heating current is reduced below the blocking temperature of the anti-ferromagnet of the magnetic stack.

The at least one anti-ferromagnet being heated may be the anti-ferromagnet that is assigned to the storage layer, e.g., the free layer, of the magnetic stack for pinning the magnetization direction of the storage layer.

Reducing the external magnetic field below a threshold field (e.g., the first switching threshold or the second switching threshold) is to be understood such that it may include the reduction of the external magnetic field below the threshold field, but still provide a weak external magnetic field, but it may also include the turning off the external magnetic field.

Reducing the heating current below the blocking temperature of the anti-ferromagnet of the magnetic stack is to be understood such that it may include the reduction of the heating current below the blocking temperature, but still provide a weak heating current, but it may also include the turning off the heating current. In one embodiment of the invention, even a negative heating current may be provided.

In one embodiment of the invention, a method of programming a magnetoresistive memory cell is provided. A heating current and an external magnetic field is applied to a magnetic stack such that an effective anisotropy field of a storage layer of the magnetic stack during thermal select heating, the effective anisotropy field being parallel to the easy axis of the magnetic stack and the external magnetic field have a non-zero angle relative to one another. The heating current and the external magnetic field are turned off at different time instants, thereby programming the magnetoresistive memory cell using the effective anisotropy field and the external magnetic field.

In one embodiment of the invention, the method further includes programming a first programming state into the magnetoresistive memory cell by carrying out a first programming process. A heating current is applied to the magnetic stack, the heating current heating at least one anti-ferromagnet of the magnetic stack to a temperature higher than a blocking temperature of the anti-ferromagnet of the magnetic stack. The external magnetic field is applied to the magnetic stack, the external magnetic field being higher than a first switching threshold required in order to switch the magnetization orientation of a storage layer of the magnetic stack into a predetermined first magnetization orientation. The external magnetic field is reduced below the first switching threshold. After having reduced the external magnetic field below the first switching threshold, the heating current is reduced below the blocking temperature of the anti-ferromagnet of the magnetic stack.

In one embodiment of the invention, the method further includes programming a second programming state into the magnetoresistive memory cell by carrying out a second programming process. A heating current is applied to the magnetic stack, the heating current heating at least one anti-ferromagnet of the magnetic stack to a temperature higher than a blocking temperature of the anti-ferromagnet of the magnetic stack. The external magnetic field is applied to the magnetic stack, the external magnetic field being higher than a first switching threshold required in order to switch the magnetization orientation of a storage layer of the magnetic stack into a predetermined first magnetization orientation. The heating current is reduced below the blocking temperature of the anti-ferromagnet of the magnetic stack. After having reduced the heating current below the blocking temperature of the anti-ferromagnet of the magnetic stack, the external magnetic field is reduced below the first switching threshold.

In one embodiment of the invention, the method further includes programming a third programming state into the magnetoresistive memory cell by carrying out a third programming process. A heating current is applied to the magnetic stack, the heating current heating at least one anti-ferromagnet of the magnetic stack to a temperature higher than a blocking temperature of the anti-ferromagnet of the magnetic stack. The external magnetic field is applied to the magnetic stack, the external magnetic field being higher than a second switching threshold required in order to switch the magnetization orientation of a storage layer of the magnetic stack into a predetermined second magnetization orientation. The heating current is reduced below the blocking temperature of the anti-ferromagnet of the magnetic stack. After having reduced the heating current below the blocking temperature of the anti-ferromagnet of the magnetic stack, the external magnetic field is reduced below the second switching threshold.

In one embodiment of the invention, the method further includes programming a fourth programming state into the magnetoresistive memory cell by carrying out a fourth programming process. A heating current is applied to the magnetic stack, the heating current heating at least one anti-ferromagnet of the magnetic stack to a temperature higher than a blocking temperature of the anti-ferromagnet of the magnetic stack. The external magnetic field is applied to the magnetic stack, the external magnetic field being higher than a second switching threshold required in order to switch the magnetization orientation of a storage layer of the magnetic stack into a predetermined second magnetization orientation. The external magnetic field is reduced below the second switching threshold. After having reduced the external magnetic field below the second switching threshold, the heating current is reduced below the blocking temperature of the anti-ferromagnet of the magnetic stack.

In one embodiment of the invention, a method of reading a magnetoresistive memory cell is provided. A first resistance value of the magnetoresistive memory cell is measured. A heating current is applied to the magnetic stack, the heating current heating an anti-ferromagnet of the magnetic stack to a temperature higher than a blocking temperature of the anti-ferromagnet of the magnetic stack. A second resistance value of the magnetoresistive memory cell in the reference state is measured. The programming state corresponding to the first resistance value is determined by comparing the first resistance value and the second resistance value.

The method may further include programming the programming state corresponding to the first resistance value into the magnetoresistive memory cell.

In another embodiment of the invention, a method of reading a magnetoresistive memory cell is provided. A first resistance value of the magnetoresistive memory cell is measured. A heating current is applied, thereby enabling a relaxation of the magnetization direction of a magnetic stack of the magnetoresistive memory cell into at least one reference direction. A second resistance value of the magnetoresistive memory cell is measured when the magnetization direction of a magnetic stack of the magnetoresistive memory cell is in the reference direction. The programming state corresponding to the first resistance value is determined by comparing the first resistance value and the second resistance value.

The method may further include programming the programming state corresponding to the first resistance value into the magnetoresistive memory cell.

The reference direction may be parallel with or antiparallel to the easy axis of the magnetic stack.

In one embodiment of the invention, a method of reading a magnetoresistive memory cell is provided. A first resistance value of the magnetoresistive memory cell is measured. A magnetic field is applied, thereby forcing the magnetization direction of a magnetic stack of the magnetoresistive memory cell into at least one reference direction. A second resistance value of the magnetoresistive memory cell is measured when the magnetization direction of a magnetic stack of the magnetoresistive memory cell is in the reference direction. The programming state corresponding to the first resistance value is determined by comparing the first resistance value and the second resistance value.

It should be mentioned that the second resistance value is measured during a time period in which the external magnetic field is turned on or off depending on whether or not the free layer of the magnetic stack has a sufficiently large rotational hysteresis.

The method may further include programming the programming state corresponding to the first resistance value into the magnetoresistive memory cell.

The reference direction may be parallel with or antiparallel to the easy axis of the magnetic stack.

FIG. 1 shows a memory cell arrangement 100 in accordance with one embodiment of the invention.

The memory cell arrangement 100 comprises a controller 102, a memory cell field 104, e.g., a memory cell array, and a power supply 108. The memory cell field 104 comprises a plurality of magnetoresistive memory cells (MRAM cells) storing data in the magnetization direction of one or more storage layers. The MRAM cells may be arranged in the memory cell field 104 in rows and columns or in any other architecture such as in zig-zag architecture. The MRAM cells are connected with each other and with the controller 102 via first control lines 106 such as bit lines, for example, or word lines, as will be described in more detail below. The controller 102 controls the processes of reading data from the MRAM cells and the processes of storing data into the MRAM cells. In order to do this, the controller 102 is connected to a power supply 108 (via second control lines 110) that provides supply voltages to the controller 102 (via first voltage supply lines 112) and to the memory cell field 104 (via second voltage supply lines 114). The supply voltages are applied to the memory cell field 104 in accordance to predetermined read processes or predetermined write processes (programming processes) that are implemented in the controller 102. The predetermined read processes or predetermined write processes may be implemented in a hard-wired fashion or may be implemented using one or more computer programs that are stored in the controller 102.

Figure 2:
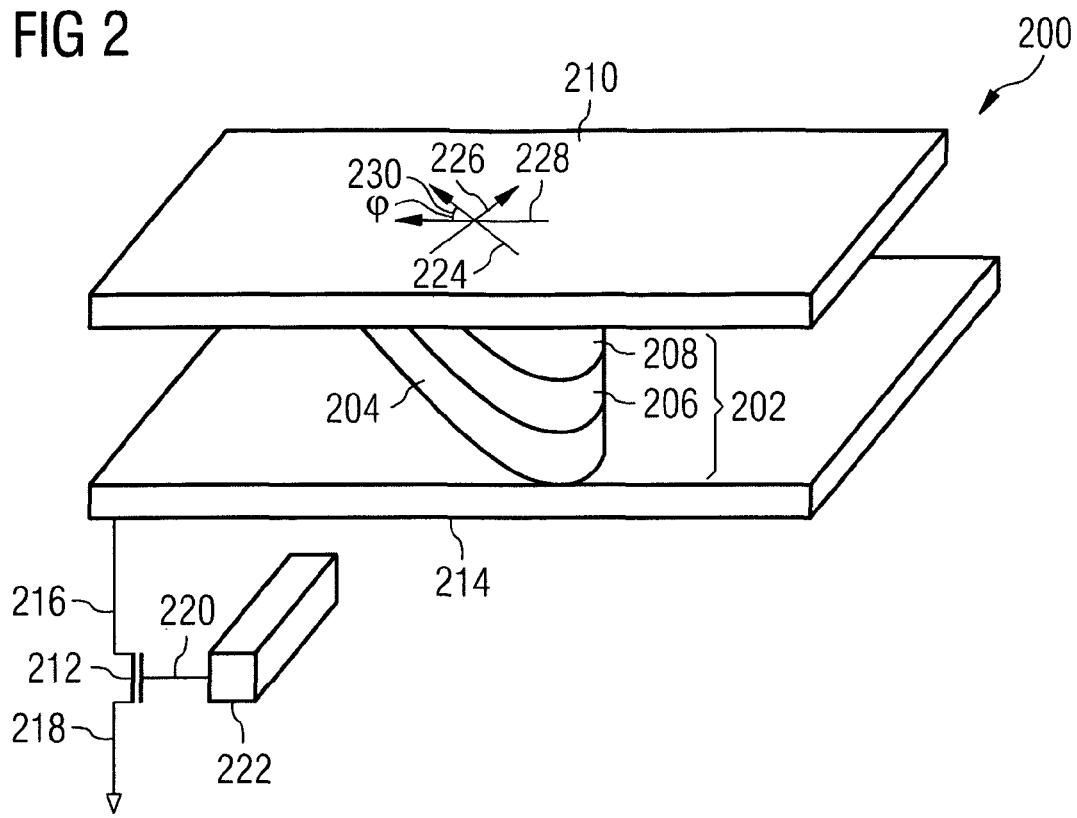
FIG. 2 illustrates an MRAM cell in accordance with a first embodiment of the present invention.

FIG. 2 shows one MRAM cell 200 of the plurality of MRAM cells of the memory cell field 104 in accordance with one embodiment of the invention. The MRAM cell 200 includes an MRAM cell stack 202 having a magnetoresistive stack of ferromagnetic layers and insulating layers such as an MTJ stack comprising a first ferromagnetic layer 204, an insulating layer 206 disposed on or above the first ferromagnetic layer 204, and a second ferromagnetic layer 208 disposed on or above the insulating layer 206. It should be mentioned that additional ferromagnetic layers or additional insulating layers may be provided. Furthermore, another type of MRAM cell stack 202 may also be provided in an alternative embodiment of the invention. In one embodiment of the invention, the first ferromagnetic layer 204 may be made of nickel (Ni), iron (Fe), or cobalt (Co), or combinations thereof (e.g., nickel iron (NiFe), cobalt iron (CoFe) and nickel iron cobalt (NiFeCo)). Those skilled in the art will appreciate that other materials may be used in alternative embodiment under the present invention.

Furthermore, in one embodiment of the invention, an anti-ferromagnet (not shown) is provided disposed below the first ferromagnetic layer 204 or disposed on or above the second ferromagnetic layer 208. In an alternative embodiment of the invention, an artificial anti-ferromagnet may be provided in addition to or instead of the anti-ferromagnet.

In one embodiment of the invention, the anti-ferromagnet is formed from a material having a blocking temperature ($T_b$) which is lower than the intended writing mode operating temperature ($T_{write}$) of the MRAM cell 200. A material's blocking temperature is the temperature above which the material exhibits a sufficiently low magnetic coercivity so that the material's magnetic polarization is readily re-oriented in the presence of a magnetizing field. The description "writing mode operating temperature" ($T_{write}$) refers to the intended temperature at which the MRAM cell 200 operates during a thermally-assisted write operation. In a particular embodiment, $T_{write}$ ranges from 150-300° C., for example, 250° C. Further, exemplary anti-ferromagnet materials exhibiting a blocking temperature below these temperatures include anti-ferromagnetic materials such as manganese alloys (e.g., iridium manganese (IrMn), iron manganese (FeMn), rhodium manganese (RhMn), platinum manganese (PtMn), platinum palladium manganese (PtPdMn), iridium manganese chromium (IrMnCr) and the like. Those skilled in the art will appreciate that other programming mode operating temperatures and anti-ferromagnet materials may be used in alternative embodiments under the present invention.

In another example, the first ferromagnetic layer 204 is composed of a material having a $T_C$ above $T_{write}$, and the second ferromagnetic layer 208 is composed of a material having a $T_C$ below $T_{write}$. In one embodiment of the invention, the MRAM cell stack 202 has a stack of ferromagnetic layers and anti-ferromagnetic layers. In one embodiment of the invention, one or both of the layers 204, 208 of the MRAM cell stack 202 have a ferromagnetic subsystem such as a layer stack including a first ferromagnetic layer (FM1)/a spacer layer (e.g., made of Ru)/a second ferromagnetic layer (FM2)/ and one or more anti-ferromagnetic layers (AFM). The curie point temperature TC_FM1 of the first ferromagnetic layer being equal with or different from the curie point temperature TC_FM2 of the second ferromagnetic layer. The spacer layer may be chosen to result in anti-ferromagnetic coupling.

Completing the MRAM cell 200, the insulating layer 206, also referred to as barrier layer 206, is magnetically coupled to the first ferromagnetic layer 204, and the free second ferromagnetic layer 208 is coupled to the barrier layer 206. The barrier layer 206 provides the magnetic tunneling junction, the electrical resistance across which determines the logical state of the MRAM cell 200, the electrical resistance determinable by the relative orientations of the magnetic fields between the first ferromagnetic layer 204 and the second ferromagnetic layer 208. Embodiments of the barrier layer 206 include silicon dioxide ($SiO_2$) aluminum oxide ($Al_2O_3$), magnesium oxide (MgO), hafnium oxide ($HfO_2$), boron oxide ($B_2O_3$), tantalum oxide ($Ta_2O_5$), zinc oxide ($ZnO_2$) and other oxides, nitrides, or other suitable dielectrics, and the like. Exemplary embodiments of the second ferromagnetic layer 208 include nickel (Ni), iron (Fe), or cobalt (Co), or combinations thereof, and in particular embodiments comprises Co alloys, such as CoFeSiMoB, CoV, CoCr which exhibits a $T_C$ below $T_{write}$.

Depending upon the construction of the MRAM cell 200, interconnects may be used to provide contact to a metal bit line 210 and a select transistor 212. In one embodiment of the invention, an interconnect 214 is a line that runs in parallel with the bit line 210 and couples the first ferromagnetic layer 204 electrically to a first source/drain region 216 of the select transistor 212. A second source/drain region 218 of the select transistor 212 is connected to ground potential or to another reference potential. Furthermore, a gate region 220 of the select transistor 212 is connected to a control line 222, via which the select transistor 212 can be controlled by means of a control signal provided by the controller 102.

The MRAM cell field 104 may be implemented in an array to provide a memory device of any particular size, for example, 1 GB or more of storage capacity.

The MRAM cell stack 202 has an ellipsoidal top view structure having an easy axis 224 and a hard axis 226, providing an effective anisotropy field (e.g., a shape anisotropy field and/or an intrinsic anisotropy field) that is parallel to the easy axis 224. The MRAM cell stack 202 having such an elongated structure provides a shape anisotropy field along its easy axis 224. In one embodiment of the invention, the easy axis 224 is aligned to a bit line direction 228, in other words to the flow direction of the current flowing through the bit line 210, with an angle φ 230 being non-zero, e.g., with an angle φ 230 being greater zero, e.g., with an angle φ 230 being in a range of 5° to 175°, e.g., with an angle φ 230 being in a range of 15° to 165°, e.g., with an angle φ 230 being in a range of 45° to 135°. In other words, the MRAM cell stack 202 provides a shape anisotropy field along a first direction and the bit line current flowing through the bit line 210 provides another magnetic field, e.g., an external magnetic field along a second direction being different from the first direction. In this way, it becomes possible to use the shape anisotropy field as a control component for setting the magnetization orientation of the second ferromagnetic layer 208 or the first ferromagnetic layer 204 (depending on which layer is the storage layer and which layer serves as the reference layer) into a large variety of different desired angles. Thus, a second metal line for providing a second external magnetic field for setting the magnetization orientation of the second ferromagnetic layer 208 or the first ferromagnetic layer 204 can be omitted. Thus, a significantly simpler state generation scheme for multilevel thermal select (TS) MRAM is proposed which uses a single field line (e.g., the bit line) only instead of two crossed lines (e.g., the bit line and a word line).

However, as will be described below in more detail, in an alternative embodiment of the invention, a second metal line can be provided such as the word line.

Figure 3:
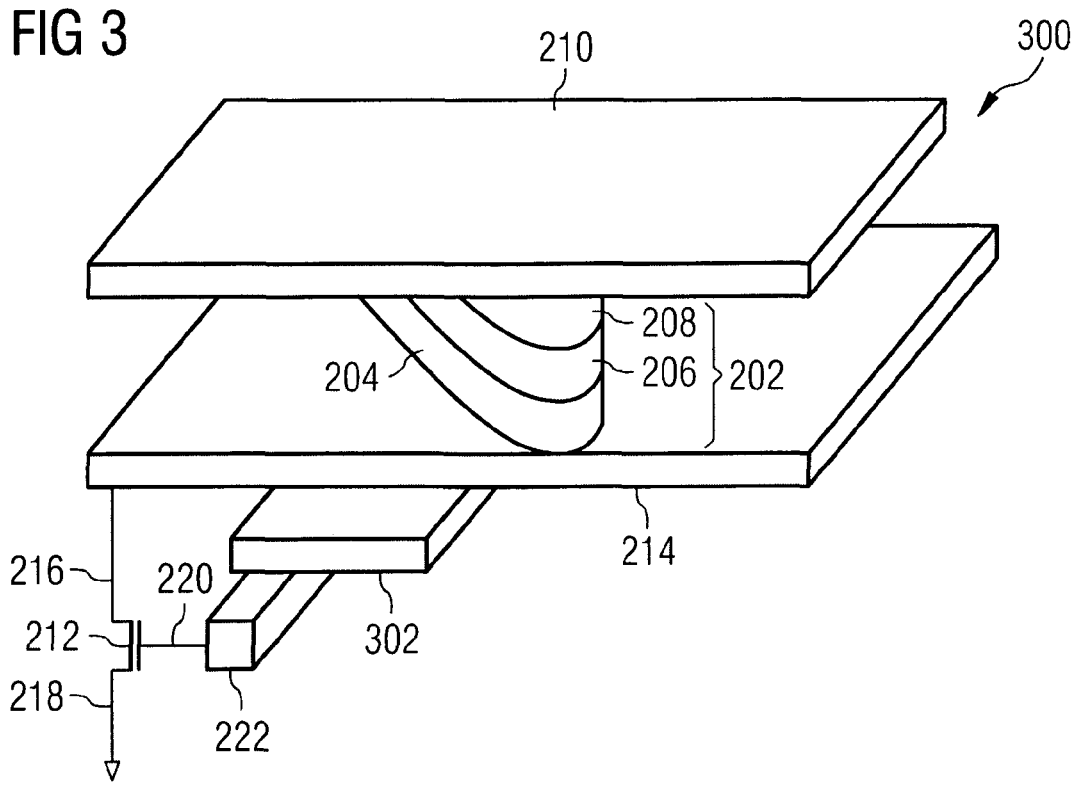
FIG. 3 illustrates an MRAM cell in accordance with a second embodiment of the present invention.

FIG. 3 illustrates an MRAM cell 300 in accordance with another embodiment of the present invention. The same reference numerals will be used for the same or similar elements of the MRAM cell 300 of FIG. 3 and the MRAM cell 200 of FIG. 2. Furthermore, in order to avoid redundancy, the components of the MRAM cell 300 of FIG. 3 that have already been explained with regard to the MRAM cell 200 of FIG. 2 will not be described again. In addition to the components of the MRAM cell 200 of FIG. 2, the MRAM cell 300 of FIG. 3 further comprises a word line 302 being connected to the control line 222. The word line 302 is connected to the controller 102. In an alternative embodiment of the invention, one or more additional bit lines may be provided. In this case, e.g., a first bit line for generating the external magnetic field and a second bit line for electrically contacting the magnetic stack.

FIGS. 4A, 4B and 4C illustrate the principle of a thermal select multi-level MRAM cell in accordance with one embodiment of the invention. In one embodiment of the invention, as shown in FIG. 4A, four magnetization states having different magnetization orientation of the first ferromagnetic layer 204 or of the second ferromagnetic layer 208 may be provided. In an alternative embodiment of the invention, any number of magnetization states having different magnetization orientations of the first ferromagnetic layer 204 or of the second ferromagnetic layer 208 may be provided, the number being mainly limited by the reading accuracy, i.e., the accuracy with which the states can be distinguished from one another during a read process, in which the respective magnetization state is read.

In one embodiment of the invention, a first magnetization state 402 is assigned to a first magnetization orientation of the first ferromagnetic layer 204 or of the second ferromagnetic layer 208, e.g., being parallel (i.e., an angle α of 0°) to a predetermined reference magnetization orientation of the reference cell or reference cells used (see diagram 400 in FIG.

4A). The first magnetization state 402 will also be referred to as bit "00" or state "00" in the following description.

In one embodiment of the invention, a second magnetization state 404 is assigned to a second magnetization orientation of the first ferromagnetic layer 204 or of the second ferromagnetic layer 208, e.g., having an angle α of about 70°, e.g., having an angle α in the range of 45° to 90°, e.g., having an angle α in the range of 60° to 75° to a predetermined reference magnetization orientation of the reference cell or reference cells used. The second magnetization state 404 will also be referred to as bit "01" or state "01" in the following description.

In one embodiment of the invention, a third magnetization state 406 is assigned to a third magnetization orientation of the first ferromagnetic layer 204 or of the second ferromagnetic layer 208, e.g., having an angle α of about 110°, e.g., having an angle α in the range of 90° to 135°, e.g., having an angle α in the range of 100° to 125° to a predetermined reference magnetization orientation of the reference cell or reference cells used. The third magnetization state 406 will also be referred to as bit "10" or state "10" in the following description.

In one embodiment of the invention, a fourth magnetization state 408 is assigned to a fourth magnetization orientation of the first ferromagnetic layer 204 or of the second ferromagnetic layer 208, e.g., being antiparallel (i.e., an angle α of 180°) to a predetermined reference magnetization orientation of the reference cell or reference cells used. The fourth magnetization state 408 will also be referred to as bit "11" or state "11" in the following description.

Referring now to FIG. 4B, a dependency of an MTJ cell signal 422 from the angular direction of the magnetization 424, in other words from the magnetization orientation of a layer with regard to a reference orientation, is shown in an MTJ cell signal diagram 420. An MTJ cell signal characteristic 426 shows a monotonically decreasing MTJ cell signal beginning from a maximum MTJ cell signal (normalized 100%) assigned to the first magnetization state 402, via an MTJ cell signal of about 67% assigned to the second magnetization state 404 and an MTJ cell signal of about 33% assigned to the third magnetization state 406, to a minimum MTJ cell signal of about 0% assigned to the fourth magnetization state 408.

Referring now to FIG. 4C, a table 440 is illustrated showing equidistant resistance levels for 2 bits with reference to the MTJ cell signal diagram 420 of FIG. 4B, which 2 bits may be stored in an MRAM cell 200, 300 in accordance with one embodiment of the invention.

Figure 5:
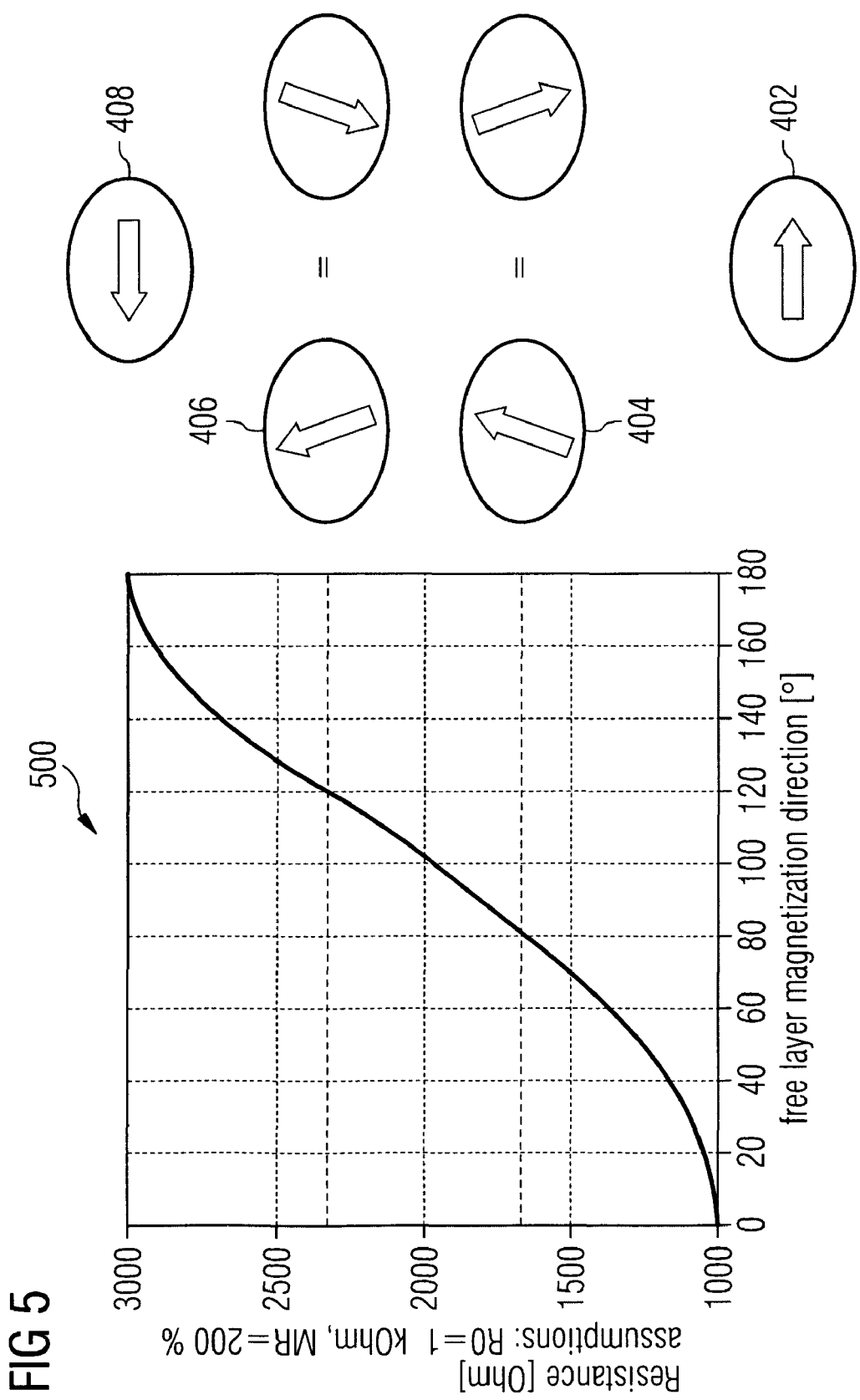
FIG. 5 shows a resistance diagram illustrating the dependency of the electrical resistance of a resistor from the magnetization orientation of the storage layer with regard to a reference magnetization orientation.

FIG. 5 shows a resistance diagram 500 illustrating the dependency of the electrical resistance using a resistor having a minimum resistance R0=1 KΩ and a magnetoresistance effect of 200%, from the magnetization orientation of the storage layer (e.g., the free layer) with regard to the reference magnetization orientation. In other words, depending on the magnetization orientation of the storage layer, the electrical resistance of the resistor ranges between 1 KΩ and 3 KΩ. FIG. 5 shows that the electrical resistance of the resistor is identical for an angle α of the magnetization orientation of about 70° and about 290° (i.e., these magnetization orientations cannot be differentiated from one another) as well as an angle α of the magnetization orientation of about 110° and about 250° (i.e., these magnetization orientations cannot be differentiated from one another).

Figure 6:
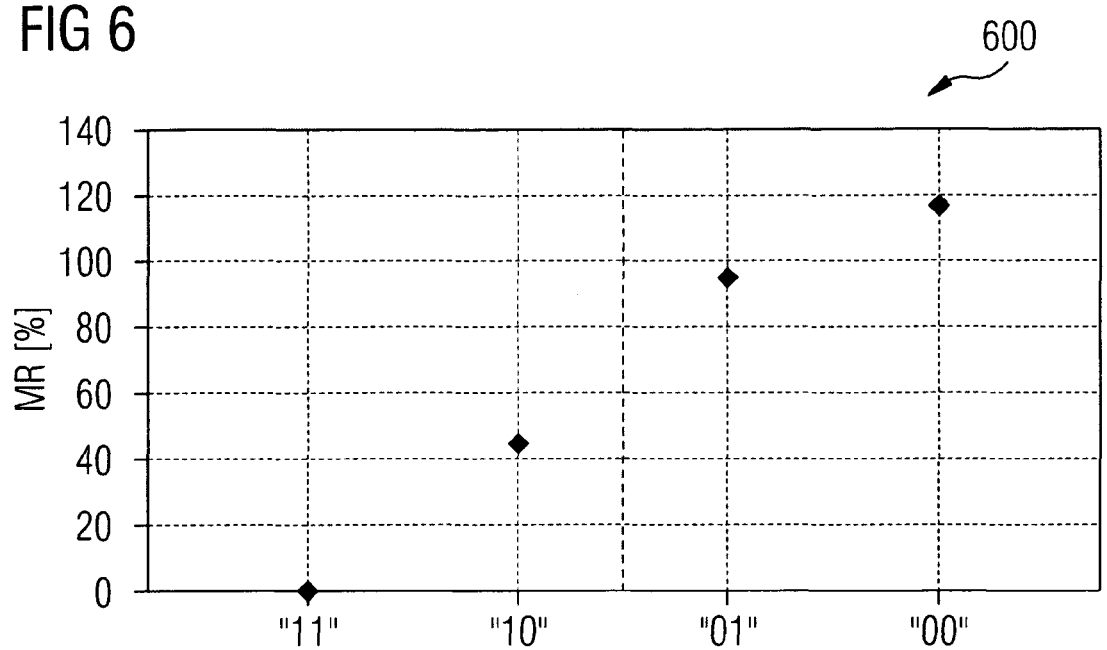
FIG. 6 shows a measured resistance diagram illustrating the dependency of the electrical resistance of a resistor from an applied external magnetic field.

FIG. 6 shows a measured resistance diagram 600 illustrating the dependency of the electrical resistance using a resistor having a minimum resistance R0=200Ω and a magnetoresistance (MR) effect of 120% for an MRAM cell having a cell size of 400*670 nm² using a bias voltage for heating the MRAM cell of about 0.7 V to about 1.5 V, from the applied external magnetic field. In other words, depending the applied external magnetic field, the electrical resistance of the resistor ranges between 200Ω and 440Ω.

Figure 7:
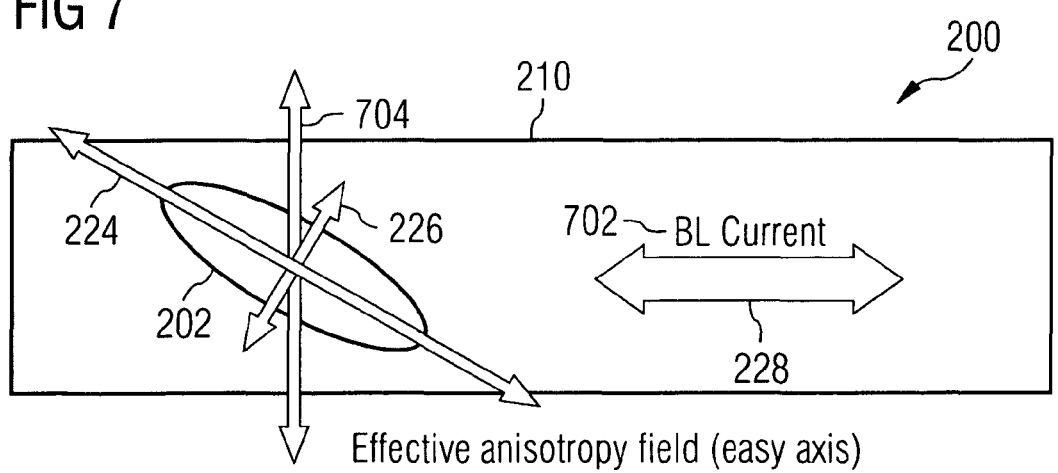
FIG. 7 shows a top view of the MRAM cell of FIG. 2.

FIG. 7 shows a top view of the MRAM cell 200 of FIG. 2. As shown in FIG. 7, the applied external magnetic field generated by the bit line current 702 flowing through the bit line 210 has a field component along an external magnetic field axis 704 being substantially perpendicular to the flow direction of the bit line current 702. As can be seen in FIG. 7, the field vector component provided by the shape anisotropy field along the easy axis 224 and the field vector component provided by the applied external magnetic field generated by the bit line current 702 span a plane being parallel to the bit line 210 and thus parallel to the main processing surface of the respective MRAM cell 200, 300, since the angle between these two field vector components are non-zero. Thus, it becomes possible to set a large variety of different desired magnetization directions of the respective MRAM cell 200, 300.

FIG. 8 shows a diagram 800 illustrating the dependency of the magnetization direction of the storage electrode (first axis 802 of the diagram 800), in other words, of the storage layer, e.g., a permalloy (Py) layer, from the direction of an applied external field (second axis 804 of the diagram 800) for an MRAM cell 200, 300. A first characteristic 806 illustrates the dependency according to the Stoner-Wohlfarth model. The diagram 800 further illustrates a mismatch of the external field direction and a Py magnetization direction for a Stoner-Wohlfarth element with $H_k$=6 kAm$^{-1}$ and a field amplitude of $H_{ext}$=5 kAm$^{-1}$. As shown in FIG. 8, the Py electrode lags behind the magnetic field as the uniaxial anisotropy exerts an additional moment on Py towards the easy axis. The case of a collinear rotation of the Py storage layer in the magnetic field is given by φ=β, i.e., no shape aniosotropy—free rotation of Py.

FIG. 9 shows a flow diagram 900 illustrating a method of programming a magnetoresistive memory cell in accordance with one embodiment of the invention. At 902, the process is started. At 904, a heating current and an external magnetic field is applied to a magnetic stack such that an effective anisotropy field, e.g., the shape anisotropy field, of a storage layer of the magnetic stack during thermal select heating, the effective anisotropy field being parallel to the easy axis of the magnetic stack and the external magnetic field have a non-zero angle relative to one another. At 906, the heating current and the external magnetic field are reduced at different time instants, thereby programming the magnetoresistive memory cell using the effective anisotropy field and the external magnetic field.

FIG. 10 shows a flow diagram 1000 illustrating a process of programming the first magnetization state 402 (state "00") into the MRAM cell 200, 300. At 1002, the process is started. At 1004, a heating current is applied, thereby heating at least one anti-ferromagnet of the magnetic stack of the MRAM cell 200, 300 to a temperature higher than the blocking temperature of the anti-ferromagnet of the MRAM cell 200, 300. At 1006, an external magnetic field is applied to the MRAM cell 200, 300, the external magnetic field being higher than a first switching threshold to switch the magnetization orientation of the MRAM cell 200, 300 to a predetermined first magnetization orientation. Furthermore, at 1008, the external magnetic field is reduced below the first switching threshold. Further, at 1010, the heating current is reduced below the blocking temperature of the anti-ferromagnet.

In an alternative embodiment of the invention, the heating current may be reduced below the blocking temperature of the anti-ferromagnet or may be turned off temporarily even before the external magnetic field is reduced below the first switching threshold or is tuned off. In this case, the heating current will be turned on again so that the temperature of the anti-ferromagnet, e.g., the anti-ferromagnet of the storage layer, e.g., the free layer, of the magnetic stack will be kept above its blocking temperature. This temporary reduction of the heating current may be provided in any of the later described embodiments as well.

FIG. 11 shows a flow diagram 1100 illustrating a process of programming the second magnetization state 404 (state "01") into the MRAM cell 200, 300. At 1102, the process is started. At 1104, a heating current is applied, thereby heating at least one anti-ferromagnet of the magnetic stack of the MRAM cell 200, 300 to a temperature higher than the blocking temperature of the anti-ferromagnet of the MRAM cell 200, 300. At 1106, an external magnetic field is applied to the MRAM cell 200, 300, the external magnetic field being higher than the first switching threshold to switch the magnetization orientation of the MRAM cell 200, 300 to the predetermined first magnetization orientation. Furthermore, at 1108, the heating current is reduced below the blocking temperature of the anti-ferromagnet, thereby clearly freezing the first magnetization orientation along the total effective field direction, which is different from the easy axis. Further, at 1110, the external magnetic field is reduced below the first switching threshold.

FIG. 12 shows a flow diagram 1200 illustrating a process of programming the third magnetization state 406 (state "10") into the MRAM cell 200, 300. At 1202, the process is started. At 1204, a heating current is applied, thereby heating at least one anti-ferromagnet of the magnetic stack of the MRAM cell 200, 300 to a temperature higher than the blocking temperature of the anti-ferromagnet of the MRAM cell 200, 300. At 1206, an external magnetic field is applied to the MRAM cell 200, 300, the external magnetic field being higher than a second switching threshold to switch the magnetization orientation of the MRAM cell 200, 300 to a predetermined second magnetization orientation. In one embodiment of the invention, the amplitude of the external magnetic field is higher than the second switching threshold, but with opposite sign compared with the external magnetic field used to switch the magnetization orientation of the MRAM cell 200, 300 to the predetermined first magnetization orientation (i.e. the first switching threshold). Furthermore, at 1208, the heating current is reduced below the blocking temperature of the anti-ferromagnet, thereby clearly freezing the second magnetization orientation along the total effective field direction which is different from the easy axis 224 of the MRAM cell 200, 300. Further, at 1210, the external magnetic field is reduced below the second switching threshold.

FIG. 13 shows a flow diagram 1300 illustrating a process of programming the fourth magnetization state 408 (state "11") into the MRAM cell 200, 300. At 1302, the process is started. At 1304, a heating current is applied, thereby heating at least one anti-ferromagnet of the magnetic stack of the MRAM cell 200, 300 to a temperature higher than the blocking temperature of the anti-ferromagnet of the MRAM cell 200, 300. At 1306, an external magnetic field is applied to the MRAM cell 200, 300, the external magnetic field being higher than the second switching threshold to switch the magnetization orientation of the MRAM cell 200, 300 to the predetermined second magnetization orientation. Furthermore, at 1308, the external magnetic field is reduced below the second switching threshold. Further, at 1310, the heating current is reduced below the blocking temperature of the anti-ferromagnet.

FIG. 14 shows a flow diagram 1400 illustrating a process of programming the first magnetization state 402 (state "00") into the MRAM cell 200, 300 in accordance with another embodiment of the invention. At 1402, the process is started. At 1404, a heating current is applied, thereby heating at least one anti-ferromagnet of the magnetic stack of the MRAM cell 200, 300 to a temperature higher than the blocking temperature of the anti-ferromagnet of the MRAM cell 200, 300. The application of the heating current is shown in a first timing diagram 1500 in FIG. 15 in a heating current curve 1502. At 1406, an external magnetic field is applied to the MRAM cell 200, 300, e.g. by applying a corresponding bit line current through the bit line 210, the external magnetic field being higher than a first switching threshold to switch the magnetization orientation of the MRAM cell 200, 300 to a predetermined first magnetization orientation. The application of the bit line current is shown in a second timing diagram 1504 in FIG. 15 in a bit line current curve 1506. After a sufficient long orientation time, the magnetization orientation of the MRAM cell 200, 300 is aligned according to the desired magnetization orientation. Furthermore, at 1408, the external magnetic field is reduced below the first switching threshold. In one embodiment of the invention, the external magnetic field is completely turned off, while the heating current is still applied such that the MRAM cell 200, 300 is heated to a temperature higher than the blocking temperature of the anti-ferromagnet of the MRAM cell 200, 300 for a predetermined time period (process 1410). The predetermined time period t is greater than 0 ns, e.g., in the range of 5 ns to 50 ns, e.g., in the range of 5 ns to 20 ns, e.g., about 10 ns. In this way, the magnetization orientation of the MRAM cell 200, 300 can relax into the orientation state with the lowest energy starting from the first magnetization orientation (the orientation 1508 of the easy axis 224), in one embodiment of the invention, the first state, as symbolized with 1510 in FIG. 15. After the predetermined time period has ended, at 1412, the heating current is reduced below the blocking temperature of the anti-ferromagnet. In one embodiment of the invention, the heating current is completely turned off. Thus, the MRAM cell 200, 300 is cooled down without an applied external magnetic field.

In an alternative embodiment, the current generating the magnetic field does not necessarily be turned off, but could be provided with sufficiently small amplitude, even with inverse sign, thereby reverse biasing the magnetic stack. In this case, an additional reset force is provided to the magnetic stack.

FIG. 16 shows a flow diagram 1600 illustrating a process of programming the second magnetization state 404 (state "01") into the MRAM cell 200, 300 in accordance with another embodiment of the invention. At 1602, the process is started. At 1604, a heating current is applied, thereby heating at least one anti-ferromagnet of the magnetic stack of the MRAM cell 200, 300 to a temperature higher than the blocking temperature of the anti-ferromagnet of the MRAM cell 200, 300. The application of the heating current is shown in a first timing diagram 1700 in FIG. 17 in a heating current curve 1702. At 1606, an external magnetic field is applied to the MRAM cell 200, 300, e.g., by applying a corresponding bit line current through the bit line 210, the external magnetic field being higher than a first switching threshold to switch the magnetization orientation of the MRAM cell 200, 300 to a predetermined first magnetization orientation. The application of the bit line current is shown in a second timing diagram 1704 in FIG. 17 in a bit line current curve 1706. After a sufficient long orientation time, the magnetization orientation of the MRAM cell 200, 300 is aligned according to the desired magnetization orientation 1708. Furthermore, at 1608, the heating current is reduced below the blocking temperature of the anti-ferromagnet. In one embodiment of the invention, the heating current is completely turned off, while the external magnetic field is still applied such that the MRAM cell 200, 300 is still exposed to the external magnetic field during the cooling down period for a predetermined time period (process 1610). The predetermined time period t is greater than 0 ns, e.g., in the range of 5 ns to 50 ns, e.g., in the range of 5 ns to 20 ns, e.g., about 10 ns. In this way, the magnetization orientation of the MRAM cell 200, 300 is "frozen" in the magnetization orientation that is determined by the external magnetic field and the easy axis of the magnetic stack of the MRAM cell 200, 300. Furthermore, after the predetermined time period has ended, at 1612, the external magnetic field is reduced below the first switching threshold. In one embodiment of the invention, the external magnetic field is completely turned off. Thus, the MRAM cell 200, 300 is "frozen in" with an applied external magnetic field in the second state, as symbolized with 1710 in FIG. 17.

FIG. 18 shows a flow diagram 1800 illustrating a process of programming the third magnetization state 406 (state "10") into the MRAM cell 200, 300 in accordance with another embodiment of the invention. At 1802, the process is started. At 1804, a heating current is applied, thereby heating at least one anti-ferromagnet of the magnetic stack of the MRAM cell 200, 300 to a temperature higher than the blocking temperature of the anti-ferromagnet of the MRAM cell 200, 300. The application of the heating current is shown in a first timing diagram 1900 in FIG. 19 in a heating current curve 1902. At 1806, an external magnetic field is applied to the MRAM cell 200, 300, e.g., by applying a corresponding bit line current through the bit line 210, the external magnetic field being higher than a second switching threshold to switch the magnetization orientation of the MRAM cell 200, 300 to a predetermined second magnetization orientation. In one embodiment of the invention, the amplitude of the external magnetic field is higher than the second switching threshold, but with opposite sign compared with the external magnetic field used to switch the magnetization orientation of the MRAM cell 200, 300 to the predetermined first magnetization orientation (i.e., the first switching threshold). The application of the bit line current is shown in a second timing diagram 1904 in FIG. 19 in a bit line current curve 1906. After a sufficient long orientation time, the magnetization orientation of the MRAM cell 200, 300 is aligned according to the desired magnetization orientation 1908. Furthermore, at 1808, the heating current is reduced below the blocking temperature of the anti-ferromagnet. In one embodiment of the invention, the heating current is completely turned off, while the external magnetic field is still applied such that the MRAM cell 200, 300 is still exposed to the external magnetic field during the cooling down period for a predetermined time period (process 1810). The predetermined time period t is greater than 0 ns, e.g., in the range of 5 ns to 50 ns, e.g., in the range of 5 ns to 20 ns, e.g., about 10 ns. In this way, the magnetization orientation of the MRAM cell 200, 300 is "frozen" parallel to the total effective field that is determined by the external magnetic field and the easy axis of the magnetic stack of the MRAM cell 200, 300. Furthermore, after the predetermined time period has ended, at 1812, the external magnetic field is reduced below the second switching threshold. In one embodiment of the invention, the external magnetic field is completely turned off. Thus, the MRAM cell 200, 300 is "frozen in" with an applied external magnetic field in the third state "10", as symbolized with 1910 in FIG. 19.

Figure 21:
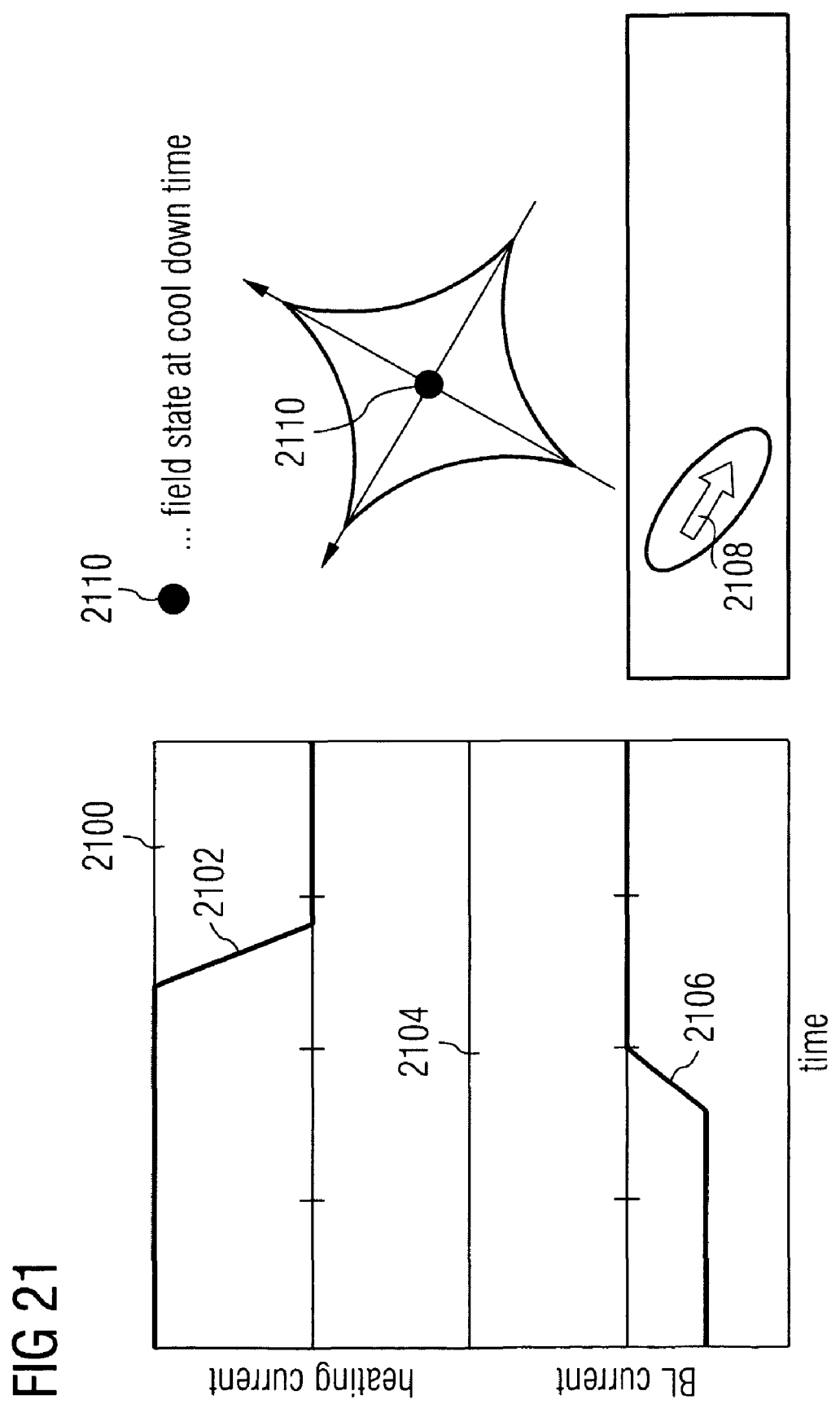
FIG. 21 shows timing diagrams illustrating a process of programming the third magnetization state into the MRAM cell in accordance with one embodiment of the invention.

FIG. 20 shows a flow diagram 2000 illustrating a process of programming the fourth magnetization state 408 (state "11") into the MRAM cell 200, 300 in accordance with another embodiment of the invention. At 2002, the process is started. At 2004, a heating current is applied, thereby heating at least one anti-ferromagnet of the magnetic stack of the MRAM cell 200, 300 to a temperature higher than the blocking temperature of the anti-ferromagnet of the MRAM cell 200, 300. The application of the heating current is shown in a first timing diagram 2100 in FIG. 21 in a heating current curve 2102. At 2006, an external magnetic field is applied to the MRAM cell 200, 300, e.g., by applying a corresponding bit line current through the bit line 210, the external magnetic field being higher than the second switching threshold to switch the magnetization orientation of the MRAM cell 200, 300 to the predetermined second magnetization orientation. The application of the bit line current is shown in a second timing diagram 2104 in FIG. 21 in a bit line current curve 2106. After a sufficient long orientation time, the magnetization orientation of the MRAM cell 200, 300 is aligned according to the desired magnetization orientation. Furthermore, at 2008, the external magnetic field is reduced below the second switching threshold. In one embodiment of the invention, the external magnetic field is completely turned off, while the heating current is still applied such that the MRAM cell 200, 300 is heated to a temperature higher than the blocking temperature of the anti-ferromagnet of the MRAM cell 200, 300 for a predetermined time period (process 2010). The predetermined time period t is greater than 0 ns, e.g., in the range of 5 ns to 50 ns, e.g., in the range of 5 ns to 20 ns, e.g., about 10 ns. In this way, the magnetization orientation of the MRAM cell 200, 300 can relax into the orientation state with the lowest energy starting from the second magnetization orientation (the orientation 2108 opposite to the direction of the first state, but parallel with the easy axis 224), in one embodiment of the invention, the fourth state, as symbolized with 2110 in FIG. 21. After the predetermined time period has ended, at 2012, the heating current is reduced below the blocking temperature of the anti-ferromagnet. In one embodiment of the invention, the heating current is completely turned off. Thus, the MRAM cell 200, 300 is cooled down without an applied external magnetic field.

It should be noted that the above-described processes are very simple pulse sequences to set the four different states. Especially the respective third process 1408, 1608, 1808, 2008, of reducing the external magnetic field or the heating current, can be extended to achieve a more tuned sequence, which also allows more than four states to be written as the angles can be controlled more flexible. By way of example, in a process in accordance with another embodiment of the invention, the strength of the bit line current may be changed to a different value as that is used in the respective process step 1406, 1606, 1806, 2006 of applying the external magnetic field (even the sign of the bit line current might be changed).

In an alternative embodiment of the invention, the "11" state 408 can also be generated by starting from the "10" state 406 and heating the magnetic stack above the blocking temperature of the at least one anti-ferromagnet even without an external magnetic field. When the temperature of the magnetic stack is 202 above the blocking temperature, the magnetic stack relaxes into the "11" state 408. Furthermore, the "00" state 402 can also be generated by starting from the "01" state 404 and heating the magnetic stack above the blocking temperature of the at least one anti-ferromagnet even without an external magnetic field. When the temperature of the magnetic stack 202 is above the blocking temperature, the magnetic stack relaxes into the "00" state 402.

In an alternative embodiment of the invention, the thresholds used for the switching may be different in the programming of each respective state.

When reading the programmed state in an MRAM cell 200, 300 in accordance with one embodiment of the invention, in general, any suitable process can be applied.

However, e.g., when using multi level writing in thermal select schemes, the maximum available MR range for parallel and antiparallel free layer (storage layer) alignment needs to be split up for the different multi level states. For a 2 bit (4 levels) system, a factor 3× increased MR requirement would be needed to achieve the same requirements for a required read out margin (RQF requirements). As for a 1 bit/cell NG MRAM for the 65 nm, the MR requirements are about 130% MR, a 2 bit/cell architecture would need 390% MR to allow the read out circuit to work as reliable. Therefore, in one embodiment of the invention, a self referencing scheme is used especially adopted to work with the above described multi level generator scheme using one or two crossed field lines. However, the reading scheme may also be used with any other programmed MRAM cell in accordance with an alternative embodiment of the invention.

In the following described embodiment, the intermediate level states (e.g., "01" state or the "10") will be classified according to the corresponding "11" or "00" resistance levels.

Figure 22:
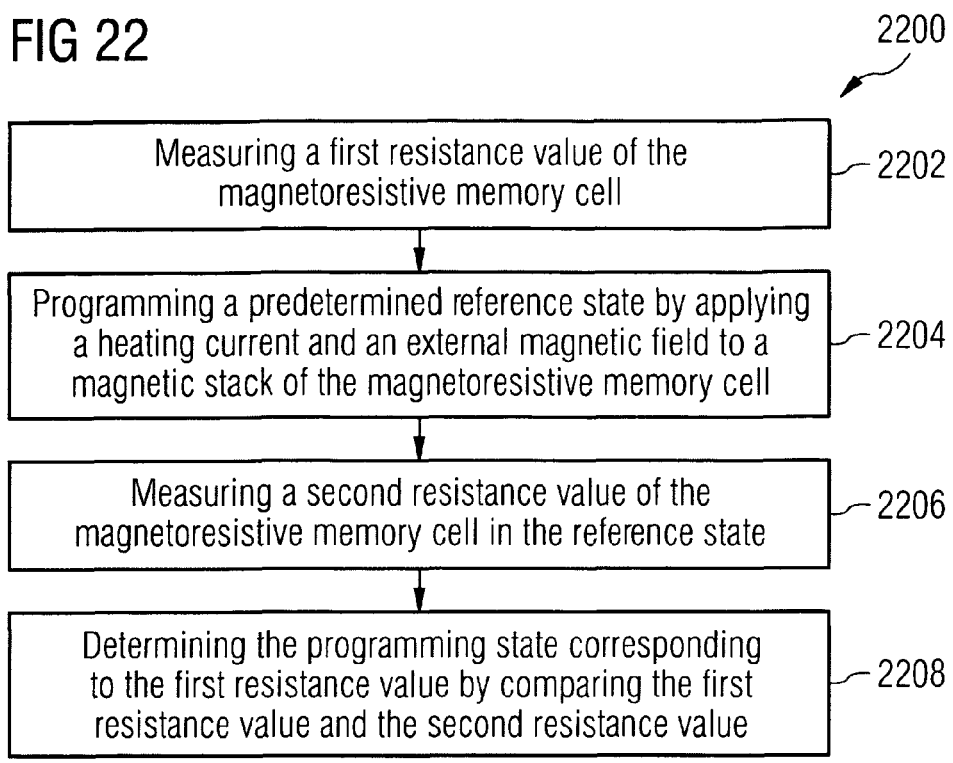
FIG. 22 shows a flow diagram illustrating a read process reading the state of an MRAM cell in accordance with one embodiment of the invention.

FIG. 22 shows a flow diagram 2200 illustrating a read process reading the state of an MRAM cell 300 having two crossed field lines for generating the external magnetic field, e.g., the bit line 210 and the word line 302, in accordance with one embodiment of the invention.

At 2202, a first resistance value of the MRAM cell 300 is measured, in other words read, and stored in a memory of the memory cell arrangement 100 (not shown).

At 2204, a predetermined reference state (e.g., "00" state or "11" state) is programmed by applying a heating current and an external magnetic field (by means of a bit line current and a word line current) to a magnetic stack of the MRAM cell 300.

At 2206, a second resistance value of the magnetoresistive memory cell in the reference state is measured and optionally stored.

At 2208, the programming state corresponding to the first resistance value is determined by comparing the first resistance value and the second resistance value. In other words, the initially read resistance state is classified by means of the mentioned comparison.

Next, the initial information that had been stored in the MRAM cell 300 is written back into the MRAM cell 300 by using a corresponding method, e.g., a programming method as described above.

Figure 23:
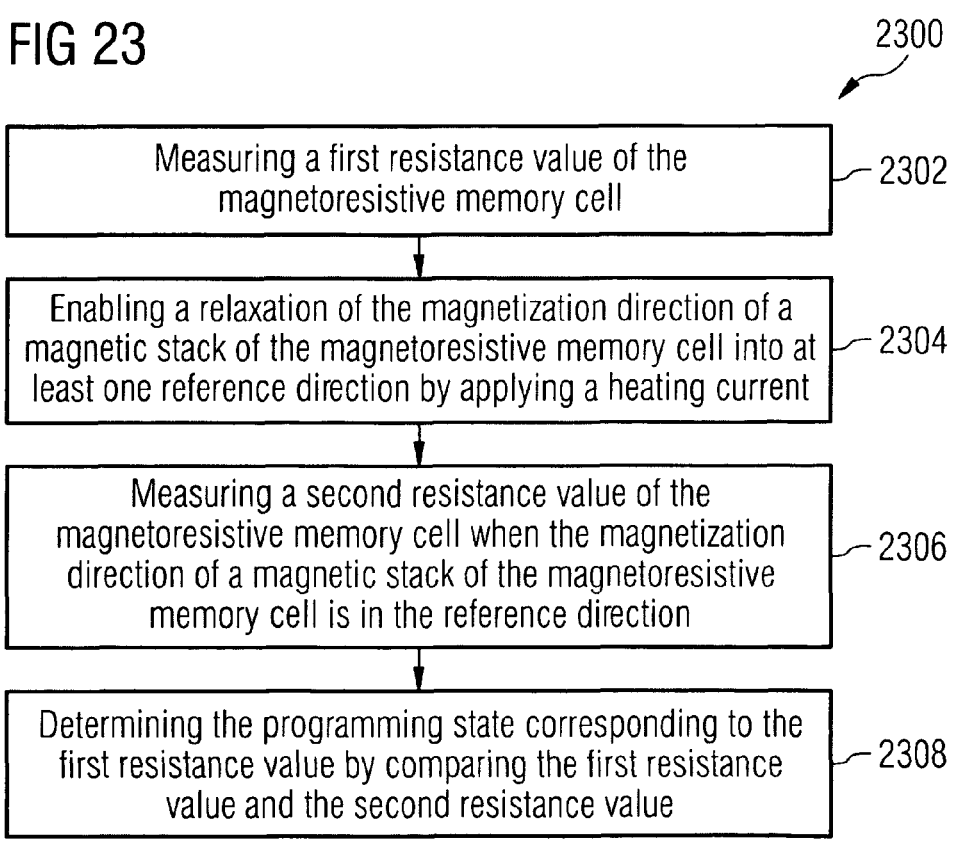
FIG. 23 shows a flow diagram illustrating a read process reading the state of an MRAM cell in accordance with another embodiment of the invention.

FIG. 23 shows a flow diagram 2300 illustrating a read process reading the state of an MRAM cell 200 having one crossed field line for generating the external magnetic field, e.g., the bit line 210, in accordance with one embodiment of the invention.

At 2302, a first resistance value of the MRAM cell 200 is measured, in other words read, and stored in a memory of the memory cell arrangement 100 (not shown).

At 2304, a relaxation of the magnetization direction of a magnetic stack of the MRAM cell 200 into a reference direction is enabled, which reference direction may parallel with or antiparallel to or perpendicular to the easy axis 224 of the magnetic stack 202 by applying a heating current, depending on the intermediate state the MRAM 200 has before the heating process (e.g. "01" state or "10" state).

At 2306, a second resistance value of the MRAM cell 200 is measured when the magnetization direction of a magnetic stack of the MRAM cell 200 is in the reference direction, which may be parallel with or antiparallel to or perpendicular to the easy axis 224 of the magnetic stack 202 of the MRAM cell 200.

At 2308, the programming state corresponding to the first resistance value is determined by comparing the first resistance value and the second resistance value.

If the initial state was the "11" state, only small or even no change in the measured resistance values can be seen. If the initial state was the "00" state, only small or even no change in the measured resistance values can be seen. In both cases the change in resistance is below a critical threshold value dR_00 or dR_11, respectively.

If the initial state was the "10" state or "01" state, a significant change in the measured resistance values can be seen.

Next, the initial information that had been stored in the MRAM cell 200 is written back into the MRAM cell 200 by using a corresponding method, e.g., a programming method as described above.

It should be noted that this readout scheme eventually uses an additional global/local reference scheme to define the "00" state and "11" state scheme.

FIG. 24 shows a flow diagram 2400 illustrating a read process reading the state of an MRAM cell 200 having one crossed field line for generating the external magnetic field, e.g., the bit line 210, in accordance with another embodiment of the invention.

At 2402, a first resistance value of the MRAM cell 200 is measured, in other words read, and stored in a memory of the memory cell arrangement 100 (not shown).

At 2404, the magnetization direction of a magnetic stack of the MRAM cell 200 is forced, in other words bent, into a reference direction, which may be parallel with or antiparallel to or perpendicular to the easy axis 224 of the magnetic stack 202 by applying a magnetic field. In other words, a field bend pulse is applied to bend the possible "01" state into the "00" state or the possible "10" state into the "11" state.

At 2406, a second resistance value of the MRAM cell 200 is measured when the magnetization direction of a magnetic stack of the MRAM cell 200 is in the reference direction, which may be parallel with or antiparallel to or perpendicular to the easy axis 224 of the magnetic stack 202. In other words, the MRAM cell 200 is read again under the bend field and the read resistance value is compared with the stored first resistance value. Thus, at 2408, the programming state corresponding to the first resistance value is determined by comparing the first resistance value and the second resistance value.

If the initial state was the "11" state, only small or even no change in the measured resistance values can be seen. If the initial state was the "00" state, only small or even no change in the measured resistance values can be seen. In both cases the change in resistance is below a critical threshold value dR_00 or dR_11, respectively.

If the initial state was the "10" state or "01" state, a significant change in the measured resistance values can be seen. Depending on the polarity of the field pulse used for bending the storage information a positive or negative change in resistance can be detected for a given intermediate state "01" or "10".

From the definition for the intermediate "01" state, the resistance change is positive when using a positive field pulse. From this definition, it results that, a "10" state will have a negative resistance change when using a positive field pulse.

When using a negative field pulse the sign will change respectively.

Therefore, when using a given field pulse polarity, it is possible to determine the correct intermediate state "01" state or "10" state based on the measured sign of the resistance change.

In other words, depending on the intermediate states the measured second resistance value will be moved closer to the "00" state or "11" state.

Next, the initial information that had been stored in the MRAM cell 200 is optionally written back into the MRAM cell 200 by using a corresponding method, e.g., a programming method as described above.

It should be noted that this readout scheme eventually uses an additional global/local reference scheme to define the "00" state and "11" state scheme.

Furthermore, it is to be pointed out that many other derivates of the above-described processes are possible and the processes described above is only an example for a 2 bit cell and would be adapted in an embodiment of an MRAM cell storing more than 2 bits.

By way of example, in case of the usage of the bend field pulse, the bending might also be achieved by bending into another reference state that is not used for data storage (e.g., the 90° resistance state, 50% MR level).

Furthermore, in another embodiment of the invention, in case of crossed word lines and bit lines being provided, the above reference state can be generated by means of a heat pulse and proper field setting pulses.

In alternative embodiments of the invention, the described processes may be used as self referencing schemes for multi level MRAM cells, e.g., in an architecture having two line generating an external magnetic field or in an architecture having one line (e.g., the bit line) generating an external magnetic field combined with the effective anisotropy field provided by the magnetic stack of the MRAM cell.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined solely by the claims appended hereto.

What is claimed is:

1. A magnetoresistive memory cell, comprising:
   a magnetic stack with an ellipse-shaped base providing an effective anisotropy field of a storage layer of the magnetic stack during thermal select heating; and
   exactly one conductor line providing a single external magnetic field to the magnetic stack, wherein the effective anisotropy field and the single external magnetic field have a non-zero angle relative to one another;
   the memory cell being coupled to a controller which is configured such that the controller programs at least four different states of the memory cell.

2. The magnetoresistive memory cell of claim 1, wherein the effective anisotropy field is parallel to an easy axis of the magnetic stack.

3. The magnetoresistive memory cell of claim 1, wherein the effective anisotropy field comprises a shape anisotropy field.

4. The magnetoresistive memory cell of claim 1, wherein the effective anisotropy field comprises an intrinsic anisotropy field.

5. The magnetoresistive memory cell of claim 1, wherein the magnetic stack and the exactly one conductor line are arranged relative to one another such that the effective anisotropy field and the single external magnetic field have a non-zero angle relative to one another.

6. The magnetoresistive memory cell of claim 1, wherein the exactly one conductor line further provides a heating current to the magnetic stack.

7. The magnetoresistive memory cell of claim 6, wherein the heating current and the single external magnetic field are provided by a single electrical current.

8. The magnetoresistive memory cell of claim 1, wherein the magnetic stack comprises a magnetic tunnel junction stack.

9. The magnetoresistive memory cell of claim 1, wherein the magnetic stack comprises:
   a first ferromagnetic layer;
   an insulating layer disposed above the first ferromagnetic layer; and
   a second ferromagnetic layer disposed above the insulating layer.

10. The magnetoresistive memory cell of claim 1, wherein the magnetic stack is arranged along its easy axis in a non-zero angle relative to the single exactly one conductor line.

11. The magnetoresistive memory cell of claim 10, wherein
   the non-zero angle between the shape anisotropy field and the single external magnetic field has a value in the range of about 15° to about 85°.

12. The magnetoresistive memory cell of claim 1, wherein the non-zero angle between the shape anisotropy field and the single external magnetic field has a value in the range of about 5° to about 175°.

13. The magnetoresistive memory cell of claim 1, wherein the exactly one conductor line comprises a metal.

14. A magnetoresistive memory cell arrangement, comprising:
   at least one magnetoresistive memory cell that includes a magnetic stack providing an effective anisotropy field of a storage layer of the magnetic stack during thermal select heating; and
   exactly one conductor line providing a single external magnetic field to the magnetic stack, the effective anisotropy field and the single external magnetic field having a non-zero angle relative to one another, wherein the exactly one conductor line is not aligned with an easy axis of the magnetic stack;
   the memory cell being coupled to a controller which is configured such that the controller programs at least four different states of the memory cell.

15. The magnetoresistive memory cell arrangement of claim 14, wherein the effective anisotropy field is parallel to the easy axis of the magnetic stack.

16. The magnetoresistive memory cell arrangement of claim 14, wherein the effective anisotropy field comprises a shape anisotropy field.

17. The magnetoresistive memory cell arrangement of claim 14, wherein the effective anisotropy field comprises an intrinsic anisotropy field.

18. The magnetoresistive memory cell of claim 14, wherein the magnetic stack and the exactly one conductor line are arranged relative to one another such that the effective anisotropy field and the single external magnetic field have a non-zero angle relative to one another.

19. The magnetoresistive memory cell arrangement of claim 14, wherein the exactly one conductor line further provides a heating current to the magnetic stack.

20. The magnetoresistive memory cell arrangement of claim 19, wherein the controller is configured such that a first programming state is programmed into the magnetoresistive memory cell by carrying out a first programming process, the first programming process comprising:
applying the heating current to the magnetic stack, the heating current heating at least one anti-ferromagnet of the magnetic stack to a temperature higher than a blocking temperature of the anti-ferromagnet of the magnetic stack;
applying the external magnetic field to the magnetic stack, the external magnetic field being higher than a first switching threshold required in order to switch the magnetization orientation of a storage layer of the magnetic stack into a predetermined first magnetization orientation;
reducing the external magnetic field below the first switching threshold; and
after having reduced the external magnetic field below the first switching threshold, reducing the heating current below the blocking temperature of the anti-ferromagnet of the magnetic stack.

21. The magnetoresistive memory cell arrangement of claim 19, wherein the controller is configured such that a second programming state is programmed into the magnetoresistive memory cell by carrying out a second programming process, the second programming process comprising:
applying the heating current to the magnetic stack, the heating current heating at least one anti-ferromagnet of the magnetic stack to a temperature higher than a blocking temperature of the anti-ferromagnet of the magnetic stack;
applying the external magnetic field to the magnetic stack, the external magnetic field being higher than a first switching threshold required in order to switch the magnetization orientation of a storage layer of the magnetic stack into a predetermined first magnetization orientation;
reducing the heating current below the blocking temperature of the anti-ferromagnet of the magnetic stack; and
after having reduced the heating current below the blocking temperature of the anti-ferromagnet of the magnetic stack, reducing the external magnetic field below the first switching threshold.

22. The magnetoresistive memory cell arrangement of claim 19, wherein the controller is configured such that a third programming state is programmed into the magnetoresistive memory cell by carrying out a third programming process, the third programming process comprising:
applying the heating current to the magnetic stack, the heating current heating at least one anti-ferromagnet of the magnetic stack to a temperature higher than a blocking temperature of the anti-ferromagnet of the magnetic stack;
applying the external magnetic field to the magnetic stack, the external magnetic field being higher than a second switching threshold required in order to switch the magnetization orientation of a storage layer of the magnetic stack into a predetermined second magnetization orientation;
reducing the heating current below the blocking temperature of the anti-ferromagnet of the magnetic stack; and
after having reduced the heating current below the blocking temperature of the anti-ferromagnet of the magnetic stack, reducing the external magnetic field below the second switching threshold.

23. The magnetoresistive memory cell arrangement of claim 19, wherein the controller is configured such that a fourth programming state is programmed into the magnetoresistive memory cell by carrying out a fourth programming process, the fourth programming process comprising:
applying the heating current to the magnetic stack, the heating current heating at least one anti-ferromagnet of the magnetic stack to a temperature higher than a blocking temperature of the anti-ferromagnet of the magnetic stack;
applying the external magnetic field to the magnetic stack, the external magnetic field being higher than a second switching threshold required in order to switch the magnetization orientation of a storage layer of the magnetic stack into a predetermined second magnetization orientation;
reducing the external magnetic field below the second switching threshold; and
after having reduced the external magnetic field below the second switching threshold, reducing the heating current below the blocking temperature of the anti-ferromagnet of the magnetic stack.

24. A magnetoresistive memory cell, comprising:
a curved magnetic stack providing an effective anisotropy field of a storage layer of the magnetic stack during thermal select heating; and
exactly one conductor line providing a single external magnetic field to the magnetic stack, wherein the effective anisotropy field and the single external magnetic field have a non-zero angle relative to one another;
the memory cell being coupled to a controller which is configured such that the controller programs at least four different states of the memory cell.

25. The magnetoresistive memory cell of claim 24, wherein the effective anisotropy field is parallel to an easy axis of the curved magnetic stack.

26. The magnetoresistive memory cell of claim 24, wherein the effective anisotropy field comprises a shape anisotropy field.

27. The magnetoresistive memory cell of claim 24, wherein the effective anisotropy field comprises an intrinsic anisotropy field.

28. The magnetoresistive memory cell of claim 24, wherein the curved magnetic stack and the exactly one conductor line are arranged relative to one another such that the effective anisotropy field and the single external magnetic field have a non-zero angle relative to one another.

29. The magnetoresistive memory cell of claim 24, wherein the single exactly one conductor line further provides a heating current to the magnetic stack.

30. The magnetoresistive memory cell of claim 29, wherein the heating current and the single external magnetic field are provided by a single electrical current.

31. The magnetoresistive memory cell of claim 24, wherein the curved magnetic stack comprises a curved magnetic tunnel junction stack.

32. The magnetoresistive memory cell of claim 24, wherein the curved magnetic stack comprises:
a first ferromagnetic layer;
an insulating layer disposed above the first ferromagnetic layer; and
a second ferromagnetic layer disposed above the insulating layer.

33. The magnetoresistive memory cell of claim 24, wherein the curved magnetic stack is arranged along the easy axis in a non-zero angle relative to the exactly one conductor line.

34. The magnetoresistive memory cell of claim 24, wherein the exactly one conductor line comprises a metal.

35. A magnetoresistive memory cell array, comprising:
a plurality of magnetoresistive memory cells that include magnetic stacks providing an effective anisotropy field of a storage layer of each magnetic stack during thermal select heating; and
a plurality of conductor lines arranged such that a exactly one conductor line from the plurality of conductor lines provides a single external magnetic field to a single magnetic stack for each magnetic stack, the effective anisotropy fields and the external magnetic fields having non-zero angles relative to each other, wherein the plurality of conductor lines are parallel;
the memory cells being coupled to a controller which is configured such that the controller programs at least four different states of the memory cells.

36. The magnetoresistive memory cell arrangement of claim 35, wherein the effective anisotropy field is parallel to an easy axis of the magnetic stack.

37. The magnetoresistive memory cell arrangement of claim 35, wherein the effective anisotropy field comprises a shape anisotropy field.

38. The magnetoresistive memory cell arrangement of claim 35, wherein the exactly one conductor line further provides a heating current to the magnetic stack.

* * * * *